(12) United States Patent
Nemoto

(10) Patent No.: US 7,288,481 B2
(45) Date of Patent: Oct. 30, 2007

(54) SEMICONDUCTOR DEVICE HAVING THROUGH ELECTRODE AND METHOD OF MANUFACTURING THE SAME

(75) Inventor: Yoshihiko Nemoto, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 379 days.

(21) Appl. No.: 11/088,952

(22) Filed: Mar. 25, 2005

(65) Prior Publication Data

US 2006/0097357 A1 May 11, 2006

(30) Foreign Application Priority Data

Nov. 9, 2004 (JP) ............................. 2004-325035

(51) Int. Cl.
*H01L 21/44* (2006.01)

(52) U.S. Cl. ............................. 438/667; 257/E21.575

(58) Field of Classification Search ................ 438/597, 438/598, 611, 666, 667; 257/E21.575, E21.059, 257/E21.598
See application file for complete search history.

(56) References Cited

FOREIGN PATENT DOCUMENTS

JP 2002-170904 6/2002

*Primary Examiner*—Scott B. Geyer
*Assistant Examiner*—Elias Ullah
(74) *Attorney, Agent, or Firm*—McDermott Will & Emery LLP

(57) ABSTRACT

With a fluid insulating material applied on a convex substrate and a fluid insulating material applied on a concave substrate, a columnar conductive portion of the convex substrate is inserted into a hole of the concave substrate. With this, a conductive portion and an internal interconnection are electrically connected with each other via a bump. Therefore, a semiconductor device having a through electrode which enables a size reduction, has high reliability and is easily formed even with a large aspect ratio, and a method of manufacturing the same are obtained.

8 Claims, 41 Drawing Sheets

SEMICONDUCTOR DEVICE HAVING THROUGH ELECTRODE AND METHOD OF MANUFACTURING THE SAME

BACKGROUND OF THE INVENTION

1. Field of the Invention

The present invention relates to a semiconductor device having a through (penetrating) electrode for electrically connecting a semiconductor substrate to another semiconductor substrate, semiconductor device or equipment, and to a method of manufacturing the same.

2. Description of the Background Art

A semiconductor device having a through electrode extending from a front surface to a back surface of a semiconductor substrate has been conventionally used. A conventional semiconductor device is formed with a method as described below.

In the method, a first hole for embedding a through electrode having a prescribed depth and an interconnection to be connected to the through electrode are first formed on a semiconductor substrate. Then, an insulation film is deposited to cover an inner peripheral surface of the first hole and the interconnection. Thereafter, a portion of the insulation film inside the first hole is removed, in which portion the through electrode will be formed. Therefore, the insulation film remains along the inner peripheral surface of the first hole. As a result, a second hole is formed inside the first hole with a surface of the insulation film. In this situation, the insulation film outside the first hole is removed so as to expose a portion of the interconnection.

Then, a conductive film (a seed layer) is deposited along an upper surface of the insulation film and a surface of the second hole. Electroplating is performed using the conductive film as a cathode to embed a metal in the second hole. The metal is embedded in a columnar form. Thereafter, a back surface of the semiconductor substrate is polished with mechanical or chemical polishing or a combination thereof until a bottom surface of the columnar metal is exposed. As a result, the bottom surface of the columnar metal is exposed on the back surface of the semiconductor substrate. This columnar metal serves as a through electrode.

In the method of manufacturing the semiconductor device having the through electrode as described above, particularly to form the through electrode having a large aspect ratio, it is necessary to form the insulation film and the seed layer having good covering properties along the inner peripheral surface and a bottom surface of the first hole having a large depth and a small opening. It is, however, extremely difficult to process as described above.

When the covering property of the insulation film described above is not good, electrical leakage in the semiconductor substrate and a malfunction of a semiconductor circuit will result in reduced yield and reliability of the semiconductor device. In addition, when the covering property of the seed layer described above is not good, the yield of the semiconductor device will be reduced because, during the electroplating, a void is generated in the metal to be the through electrode.

In the step of embedding the metal in the second hole with electroplating, the metal is basically formed well in a portion in which an agent solution flows at a high rate. Therefore, the metal is formed sufficiently in an upper portion of the second hole, in which portion the agent solution flows at a high rate, while the metal is formed insufficiently in a portion near a bottom surface of the second hole, in which portion the agent solution flows at a low rate. That is, as the metal grows faster in the upper portion than in a lower portion in the second hole, the upper portion of the second hole will be closed while the lower portion of the second hole has a void therein.

The above-described problem is resolved by decreasing aspect ratios of the first and second holes. To decrease the aspect ratios, openings of the first and second holes may be enlarged or depths of the first and second holes may be decreased.

Enlargement of openings of the first and second holes, however, inhibits a size reduction of the semiconductor device. To decrease depths of the first and second holes, on the other hand, a thickness of the semiconductor substrate must be decreased. This leads to decreased rigidity of the semiconductor substrate. As a result, reliability of the semiconductor device is decreased. In addition, manufacturing steps will be increased if a support board is fixed to the semiconductor device to reinforce the semiconductor substrate when a thin semiconductor substrate is formed. Furthermore, the support board and an adhesive for adhering the support board to the semiconductor device have limitations such that they must have heat and chemical resistances and must allow easy peeling of the support board from the semiconductor device.

SUMMARY OF THE INVENTION

An object of the present invention is to provide a semiconductor device having a through electrode which enables a size reduction, has high reliability and is easily formed even with a large aspect ratio, and to provide a method of manufacturing the same.

A semiconductor device according to the present invention includes a semiconductor substrate having a semiconductor circuit. A surface of the semiconductor substrate including the semiconductor circuit is covered with a first insulation film. An internal interconnection is formed in the first insulation film. A second insulation film is formed on the first insulation film. A conductive portion is formed in the second insulation film. The conductive portion is electrically connected to the internal interconnection directly or via another member, and is exposed on a main surface of the second insulation film.

In addition, a columnar conductive portion is electrically connected to a lower surface of the conductive portion directly or via another member. The columnar conductive portion extends in a direction of a thickness of the semiconductor substrate and is exposed on a back surface of the semiconductor substrate. A through hole extends in the semiconductor substrate so as to include the columnar conductive portion. An inner wall of the through hole is insulated from the columnar conductive portion by an insulation portion. The insulation portion and the second insulation film are formed integrally.

According to a construction described above, the columnar conductive portion to be a through electrode can be formed with a method of manufacturing a semiconductor device described below. Therefore, a semiconductor device having a through electrode with high reliability can be formed.

A method of manufacturing a semiconductor device according to the present invention includes the step of preparing a concave substrate and a convex substrate.

The concave substrate includes a semiconductor substrate having a semiconductor circuit, a first insulation film provided to cover a main surface of the semiconductor substrate including the semiconductor circuit, and an internal interconnection provided in the first insulation film, and a concave portion is provided in the first insulation film and the semiconductor substrate to extend in a direction of thicknesses of the first insulation film and the semiconductor substrate.

The convex substrate includes a temporary substrate, a conductive portion formed on the temporary substrate and a columnar conductive portion extending in a direction perpendicular to a main surface of the temporary substrate.

In addition, the method of manufacturing a semiconductor device according to the present invention includes the step of fitting the concave substrate with the convex substrate with a fluid insulating material applied on a joint surface of at least one of the convex substrate and the concave substrate, or fitting the concave substrate with the convex substrate with a clearance left therebetween and injecting a fluid insulating material into the clearance.

In addition, the method of manufacturing a semiconductor device according to the present invention further includes the steps of electrically connecting the conductive portion to the internal interconnection directly or via another member, setting the fluid insulating material to form a second insulation film, polishing a back surface of the semiconductor substrate to expose the columnar conductive portion, and removing the temporary substrate to expose the conductive portion.

According to the method as described above, reliability of the semiconductor device having a through electrode is increased because a step of depositing a film on an inner wall of the concave portion of the concave substrate is not required, which step is difficult to control. In addition, since an insulation film having a low permittivity and a large thickness can be used, high-speed performance of the semiconductor device is not suppressed by defectiveness of the insulation film. In addition, the temporary substrate having the columnar conductive portion formed therein functions as a support body when the back surface of the semiconductor device is polished. Therefore, as a separate step of attaching the support body is not required according to the method described above, manufacturing steps of a semiconductor device can be decreased.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
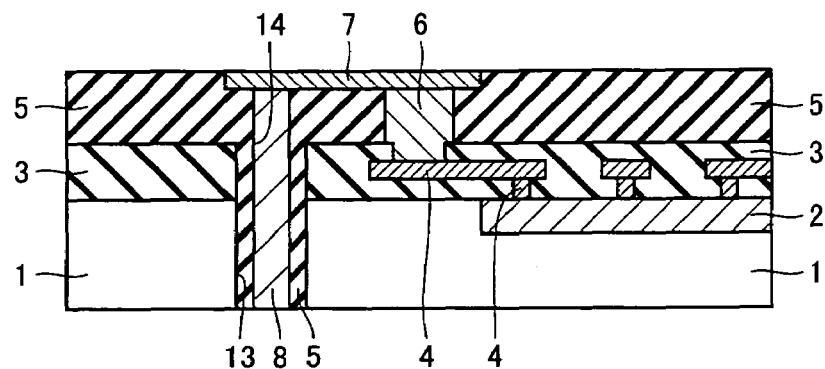
FIG. 1 shows a structure of a semiconductor device according to a first embodiment.

A semiconductor device according to each embodiment of the present invention and a method of manufacturing the semiconductor device will now be described in the following referring to the drawings. It is to be noted that, in each embodiment, a portion having similar structure and function is indicated with the same character and a description thereof is not repeated.

First Embodiment

A structure of a semiconductor device according to a first embodiment is described using FIG. 1.

As shown in FIG. 1, the semiconductor device of this embodiment includes a semiconductor substrate 1. A semiconductor circuit 2 is formed in semiconductor substrate 1. An insulation film 3 is formed so as to cover a surface of semiconductor substrate 1 including a surface of semiconductor circuit 2. An internal interconnection 4 is formed in insulation film 3. Internal interconnection 4 is connected to semiconductor circuit 2. An insulation film 5 is formed on insulation film 3. In addition, a bump 6 is provided to penetrate through insulation film 5 in a vertical direction. Bump 6 is connected to internal interconnection 4.

A conductive portion 7 is also formed in insulation film 5. Main surfaces of conductive portion 7 and insulation film 5 are on the same plane. That is, conductive portion 7 is exposed on a surface of insulation film 5. In addition, conductive portion 7 is connected to an upper surface of bump 6. A hole 13 is provided in insulation film 3 and semiconductor substrate 1 to penetrate through insulation film 3 and semiconductor substrate 1 in a direction of thicknesses thereof. Insulation film 5 is embedded in hole 13 along an inner peripheral surface of hole 13 as an insulation portion of the present invention. It is to be noted that, a columnar conductive portion 8 described below is insulated from semiconductor substrate 1 by insulation portion 5.

A hole 14 is formed with an inner peripheral surface of insulation film 5. Columnar conductive portion 8 is provided in hole 14. Columnar conductive portion 8 has one end connected to a lower surface of conductive portion 7 and the other end exposed on a back surface of semiconductor substrate 1. An exposed surface of columnar conductive portion 8, a lower surface of insulation film 5 and the back surface of semiconductor substrate 1 are on the same plane.

Columnar conductive portion 8 described above functions as a through electrode connected to another semiconductor substrate, semiconductor device or equipment. This enables to stack a plurality of semiconductor devices according to this embodiment or the semiconductor device according to this embodiment and another semiconductor device or equipment. As a result, large-scale integration of electronic circuits is allowed.

A method for manufacturing the semiconductor device having the structure as shown in FIG. 1 will now be described using FIGS. 2-9.

Figure 2:
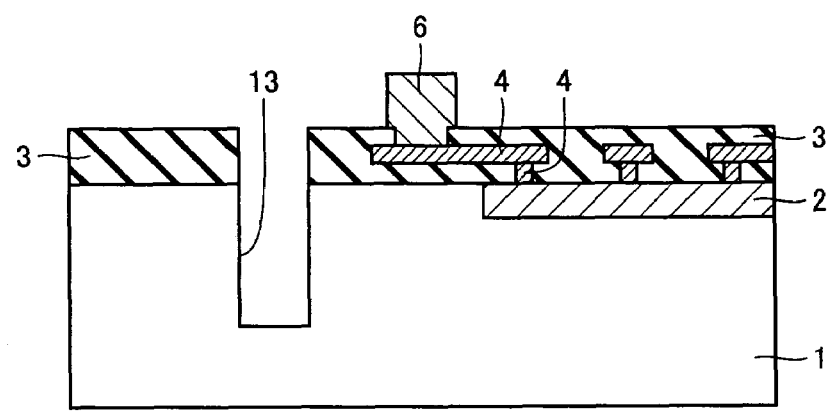
FIGS. 2-9 are views for describing a method of manufacturing the semiconductor device according to the first embodiment.

First, a concave substrate as shown in FIG. 2 is formed. In the concave substrate shown in FIG. 2, the same portion as in the structure of the semiconductor device shown in FIG. 1 is indicated with the same character and a description thereof will not be repeated. The concave substrate shown in FIG. 2 has a structure just after hole 13 is formed in insulation film 3 and semiconductor substrate 1 in a direction of thicknesses thereof. At this stage, hole 13 does not reach the back surface of semiconductor substrate 1. Then, as shown in FIG. 3, an insulating material 5a is applied so as to fill hole 13 and cover a side surface of bump 6.

Figure 3:
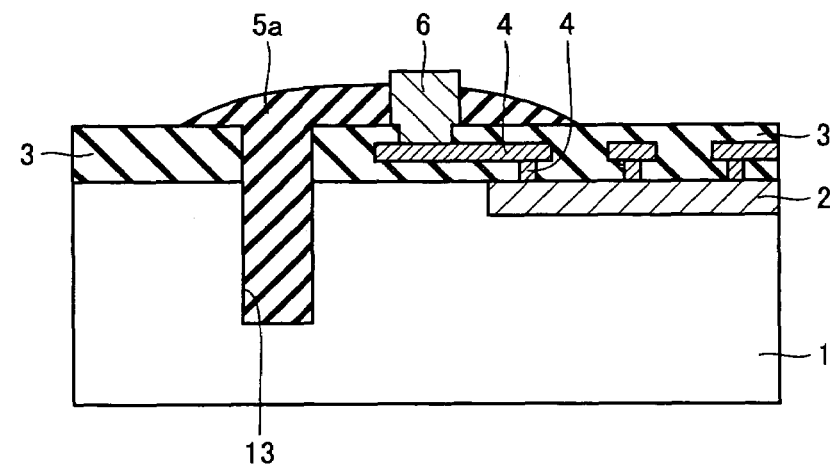
Figure 4:
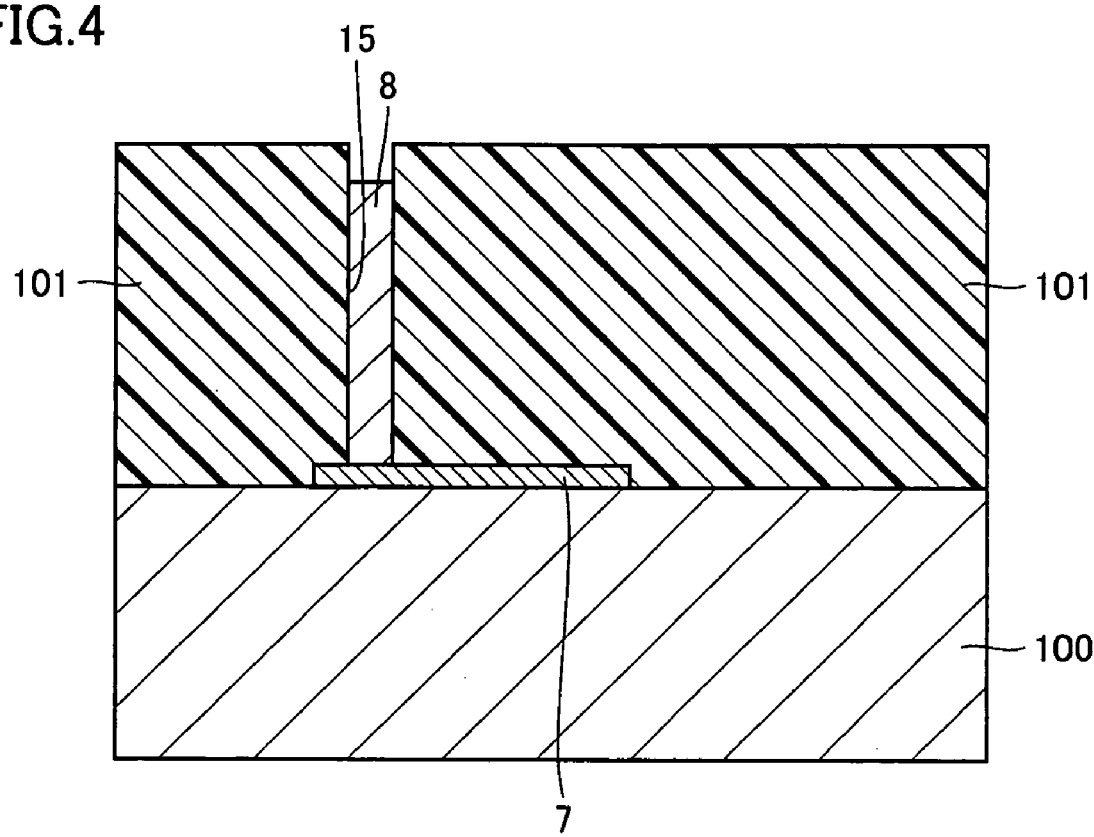
Figure 5:
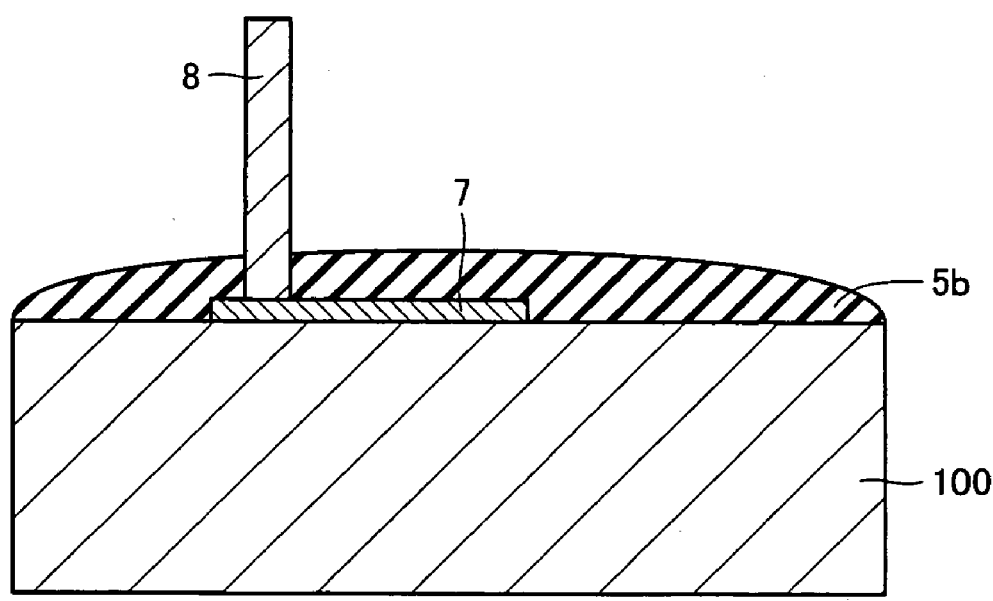

On the other hand, a convex substrate as shown in FIGS. 4 and 5 is formed with steps separate from the steps of forming the concave substrate as shown in FIGS. 2 and 3 described above. A structure shown in FIG. 4 is formed by a method as follows.

First, conductive portion 7 is formed on a metal plate 100 as a temporary substrate. Then, a resist film 101 is formed so as to cover a main surface of metal plate 100 and conductive portion 7. It is to be noted that, since metal plate 100 is to be removed in a subsequent step by etching, it is preferably made of a material such as aluminum which is easily etched. Thereafter, a hole 15 is formed in resist film 101.

Columnar conductive portion 8 is then formed in hole 15. As a result, the structure as shown in FIG. 4 is obtained. In this step, electroplating is performed using metal plate 100 and conductive portion 7 as a cathode. With this, columnar conductive portion 8 is formed from a bottom surface of hole 15 to be extended upward, that is, in a bottom-up manner. As a result, a void as mentioned in the description of the background art is not formed in columnar conductive portion 8. That is, columnar conductive portion 8 is in a good condition. Thereafter, resist film 101 is removed. Thus, columnar conductive portion 8 is formed to extend from a main surface of conductive portion 7 in a direction perpendicular to a main surface of metal plate 100. Then, an insulating material 5b is applied so as to cover metal plate 100 and conductive portion 7. As a result, a structure as shown in FIG. 5 is obtained.

It is to be noted that, though each of insulating materials 5a and 5b may be any material provided that it is fluid at a low temperature, a material such as low-melting glass, polyimide or NCP (non-conductive paste) is preferred.

Figure 6:
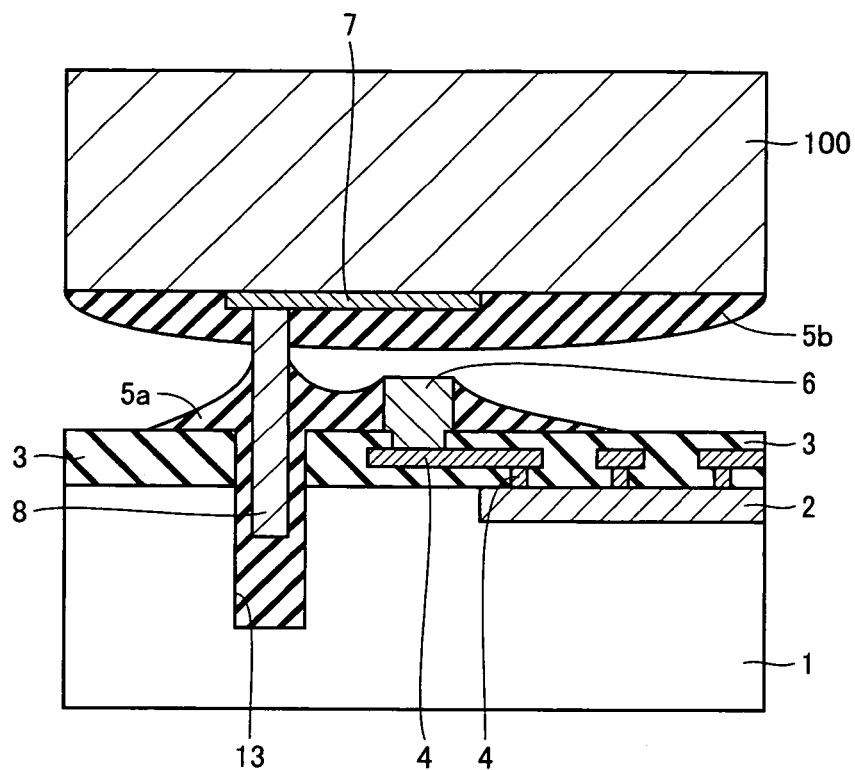
Figure 7:
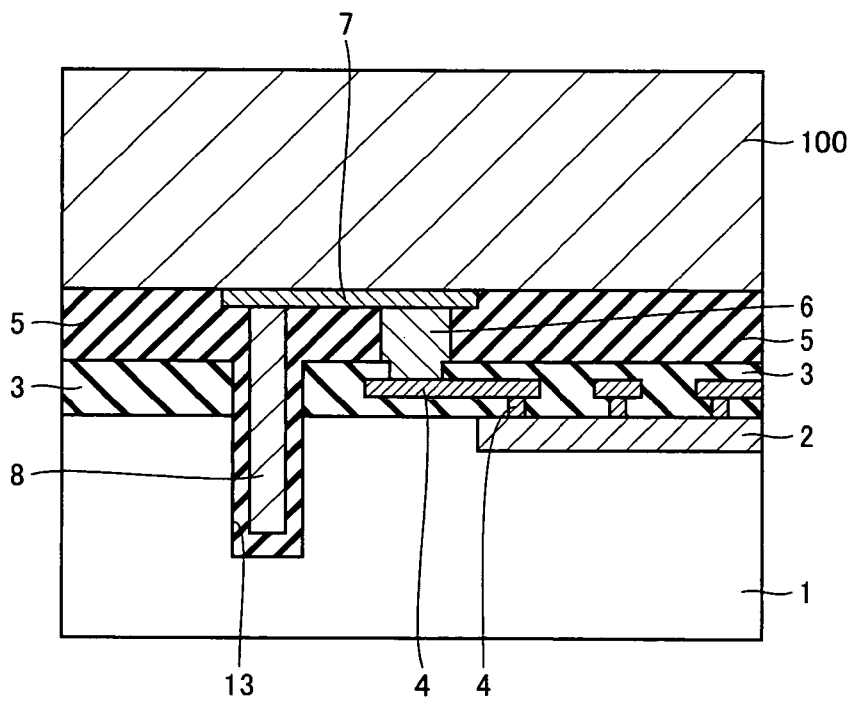

Then, as shown in FIG. 6, the concave substrate shown in FIG. 3 and the convex substrate shown in FIG. 5 are fitted with each other. That is, columnar conductive portion 8 is inserted into hole 13. With this, insulating material 5a in hole 13 is extruded from hole 13. Insulating materials 5a and 5b extend over a whole space between the convex and concave substrates. Thereafter, insulating materials 5a and 5b are incorporated with each other and set. In this step, bump 6 is connected to conductive portion 7. As a result, a structure as shown in FIG. 7 is formed. It is to be noted that, though both of insulating materials 5a and 5b are used in this embodiment to bond the convex and concave substrates together, the convex and concave substrates may be bonded together with only one of the insulating materials.

Figure 8:
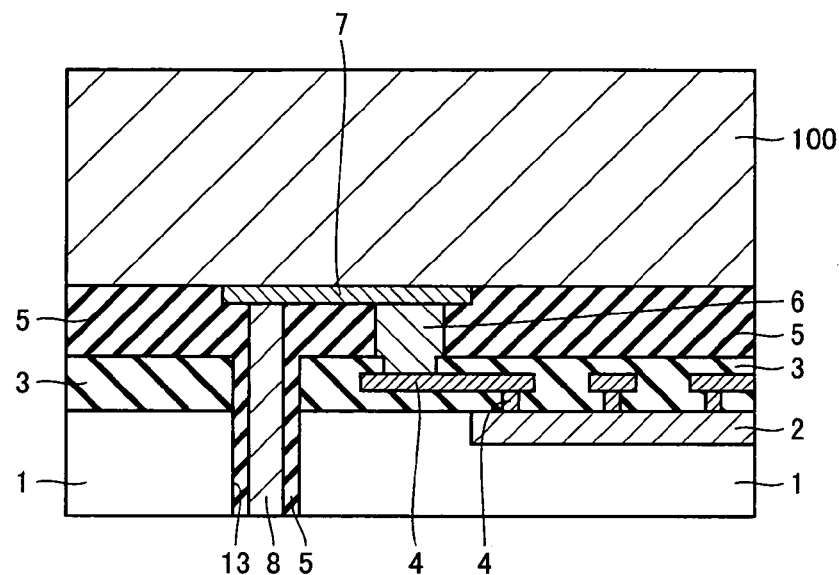
Figure 9:
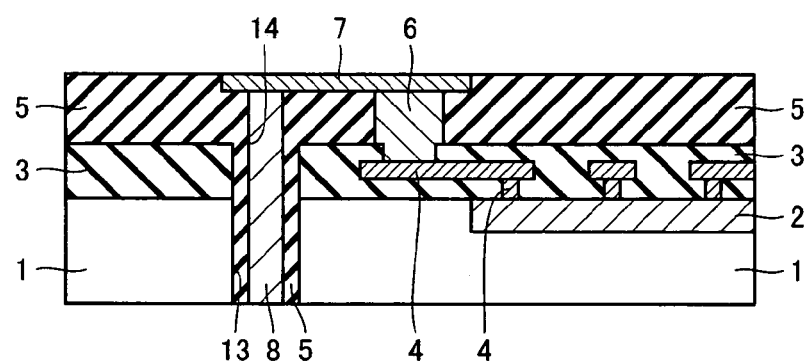

Then, semiconductor substrate 1 is polished from a back surface thereof to a prescribed height position. With this, columnar conductive portion 8 is exposed on the back surface of semiconductor substrate 1, as shown in FIG. 8. Metal plate 100 is then removed by etching. With this, conductive portion 7 is exposed, as shown in FIG. 9.

According to the above-described method of manufacturing a semiconductor device in this embodiment, the step of forming an insulation film having a high covering property on an inner peripheral surface of hole 13 having a large aspect ratio as mentioned in the description of the background art is not required. Therefore, a good through electrode can be formed with relative ease.

In addition, according to the method of manufacturing the semiconductor device in this embodiment as described above, a possibility of formation of a void in hole 13 is decreased because columnar conductive portion 8 can be formed in a manner such that, using metal plate 100 as a cathode, columnar conductive portion 8 is gradually deposited upward on a surface of metal plate 100 inside hole 15 of resist film 101 as a die (which is referred to as a "bottom-up manner" hereafter). As a result, reliability of the semiconductor device is increased.

Furthermore, a conventional technique requires a specific step for providing a reinforcement member to reinforce semiconductor substrate 1 which is made thinner by polishing and therefore has decreased mechanical strength. According to the method of manufacturing the semiconductor device in this embodiment, however, metal plate 100 of the convex substrate acts as a reinforcement member when the back surface of semiconductor substrate 1 is polished to expose the bottom surface of columnar conductive portion 8. Therefore, the specific step for providing the reinforcement member is not required. As a result, manufacturing steps of the semiconductor device are simplified.

In addition, according to the method of manufacturing the semiconductor device in this embodiment, when columnar conductive portion 8 is inserted into hole 13, a pressure is applied to fluid insulating materials 5a and 5b by columnar conductive portion 8 to avoid formation of a void between the inner peripheral surface of hole 13 and columnar conductive portion 8. This provides a good condition of insulation film 5. As a result, insulation film 5 having a large thickness and a low permittivity can be formed. That is, a parasitic capacitance generated in the through electrode when a current flows through the through electrode can be decreased. As a result, a high-speed operation of the semiconductor device is not suppressed by defectiveness of insulation film 5.

It is to be noted that, in this embodiment, a method is employed in which the concave substrate is fitted with the convex substrate with the fluid insulating materials applied on joint surfaces of the convex and concave substrates. The semiconductor device having the structure as shown in FIG. 1, however, can be manufactured by a method in which conductive portion 7 is brought into contact with bump 6 while a clearance is left between the concave and convex substrates and a fluid insulating material is injected into the clearance.

Second Embodiment

A structure of a semiconductor device according to a second embodiment will now be described using FIG. 10.

Figure 10:
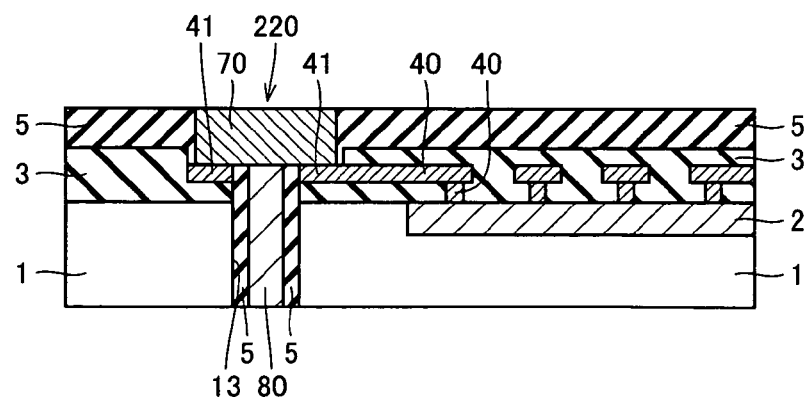
FIG. 10 shows a structure of a semiconductor device according to a second embodiment.

The semiconductor device according to this embodiment as shown in FIG. 10 has a structure similar to that of the semiconductor device according to the first embodiment shown in FIG. 1. The semiconductor device of this embodiment, however, is different from the semiconductor device of the first embodiment in the following points.

In the semiconductor device according to this embodiment, an internal interconnection 40 is provided in place of internal interconnection 4. A portion of internal interconnection 40 is defined as a connection portion 41. A conductive portion 70 is connected to an upper surface of connection portion 41. A columnar conductive portion 80 is connected to a lower surface of conductive portion 70. That is, the semiconductor device of this embodiment has a nail-like through electrode 220, as shown in FIG. 10. It is to be noted that, in the second embodiment as compared with the first embodiment, a portion having the same structure and function is indicated with the same character and thus a description thereof will not be repeated.

Figure 11:
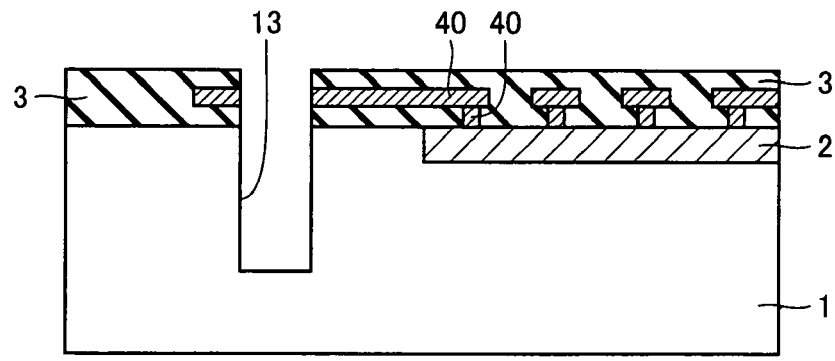
FIGS. 11-19 are views for describing a method of manufacturing the semiconductor device according to the second embodiment.

A method of manufacturing the semiconductor device according to this embodiment will now be described using FIGS. 11-19. The method of manufacturing the semiconductor device according to this embodiment is similar to that in the first embodiment. In place of the concave substrate shown in FIG. 2 which is formed in the first embodiment, a concave substrate as shown in FIG. 11 is formed in this embodiment. The structure shown in FIG. 11 is different from that shown in FIG. 2 in the following points.

Figure 12:
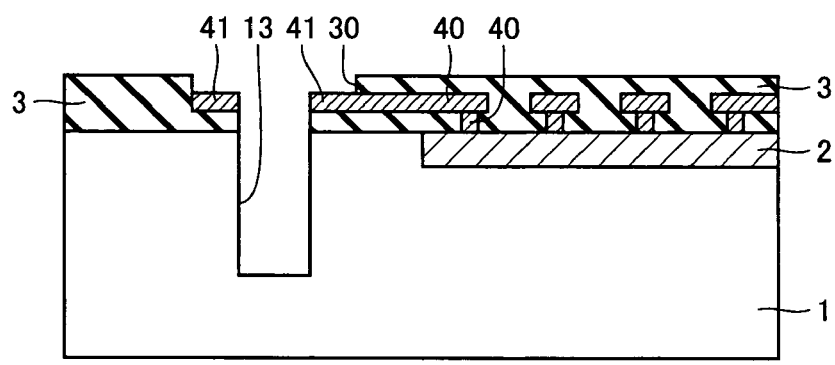
Figure 13:
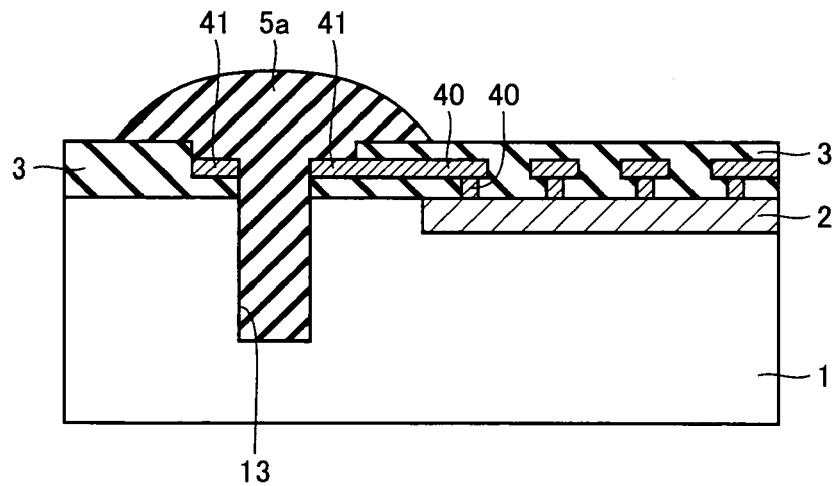

In the structure shown in FIG. 11, bump 6 in the structure shown in FIG. 2 is not provided and internal interconnection 40 is provided so as to surround hole 13. After the structure shown in FIG. 11 is formed, insulation film 3 around an opening of hole 13 is removed to expose a portion of internal interconnection 40 as connection portion 41, as shown in FIG. 12. Then, insulating material 5a is applied so as to fill an exposed surface of connection portion 41 and hole 13. A resulting structure is shown in FIG. 13.

Figure 16:
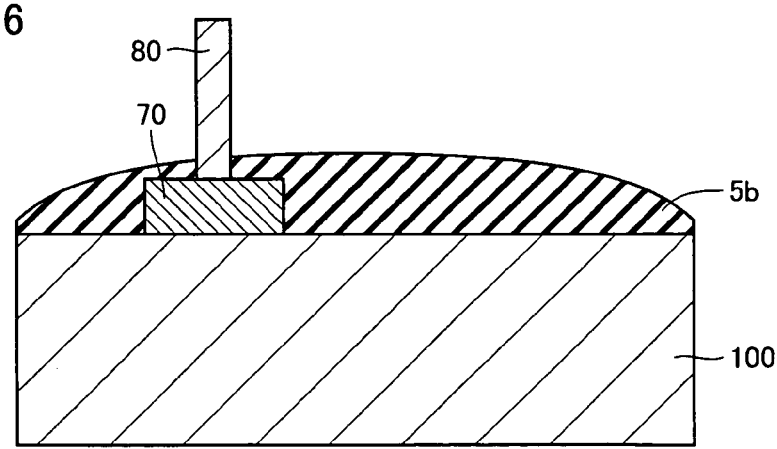

In addition, in place of the convex substrate shown in FIG. 5 which is formed in the first embodiment, a convex substrate as shown in FIG. 16 is formed in this embodiment. The convex substrate of this embodiment is formed with a method as follows.

Figure 14:
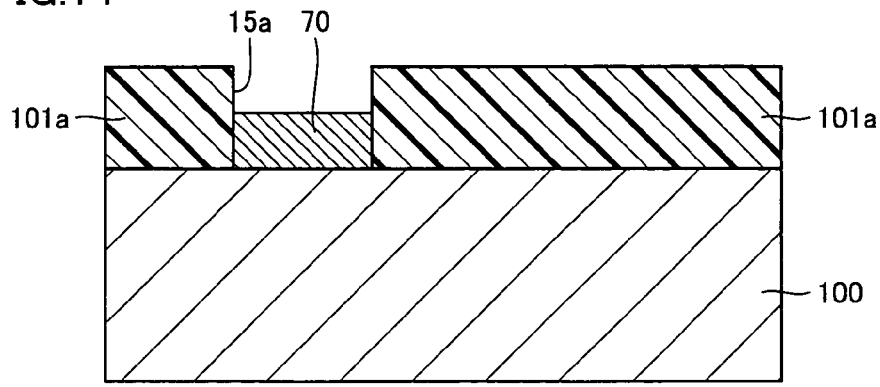

First, a resist film 101a is formed on metal plate 100. Then, a portion of resist film 101a is removed to form a hole 15a. Conductive portion 70 is then formed in hole 15a. As a result, a structure as shown in FIG. 14 is obtained.

Figure 15:
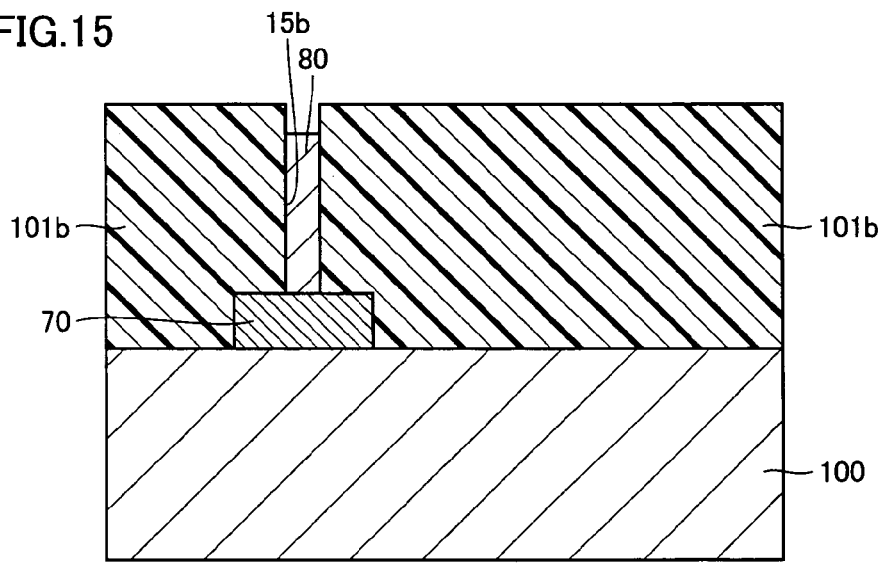

Thereafter, resist film 101a is removed. Then, a resist film 101b is formed so as to cover conductive portion 70 and a main surface of metal plate 100. Thereafter, a hole 15b is formed to penetrate through resist film 101b in a vertical direction and reach conductive portion 70. Then, columnar conductive portion 80 is formed in hole 15b. As a result, a structure as shown in FIG. 15 is obtained. It is to be noted that, columnar conductive portion 80 is formed by electroplating using metal plate 100 and conductive portion 70 as a cathode.

Figure 17:
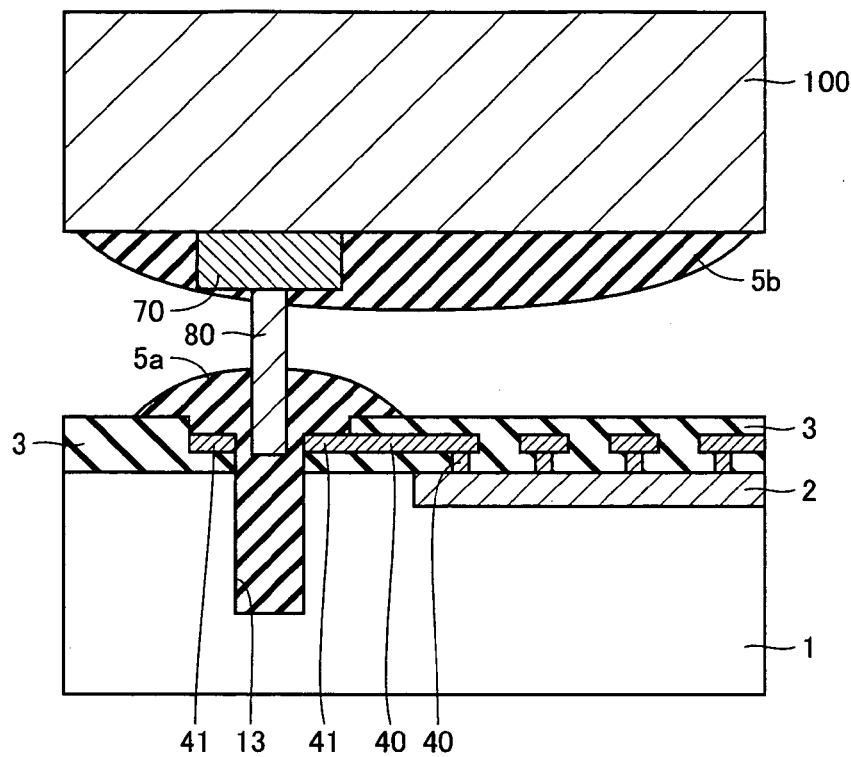
Figure 18:
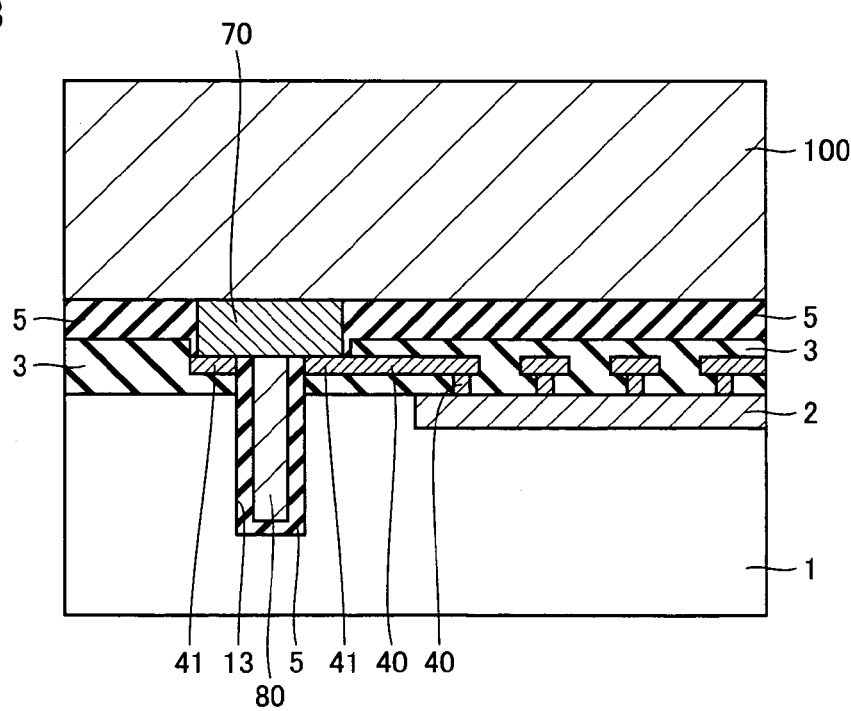

Then, resist film 101b is removed. Thereafter, insulating material 5b is formed so as to cover the main surface of metal plate 100 and conductive portion 70. As a result, a structure as shown in FIG. 16 is obtained. Then, as shown in FIG. 17, the convex substrate shown in FIG. 16 is fitted with the concave substrate shown in FIG. 13. Thereafter, insulating materials 5a and 5b set. As a result, a structure having insulation film 5 filling a space between the convex and concave substrates is formed. With this, a structure as shown in FIG. 18 is obtained.

Figure 19:
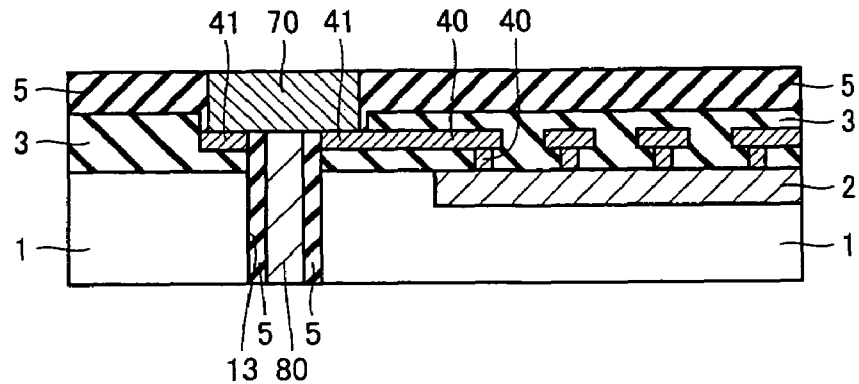
Figure 20:
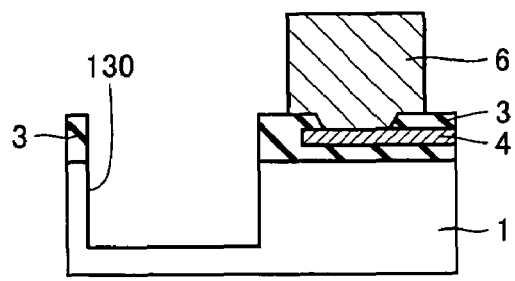
FIG. 20 shows a concave substrate of a semiconductor device according to a third embodiment, which is a cross-sectional view taken along the line XX-XX in FIG. 21.
Figure 21:
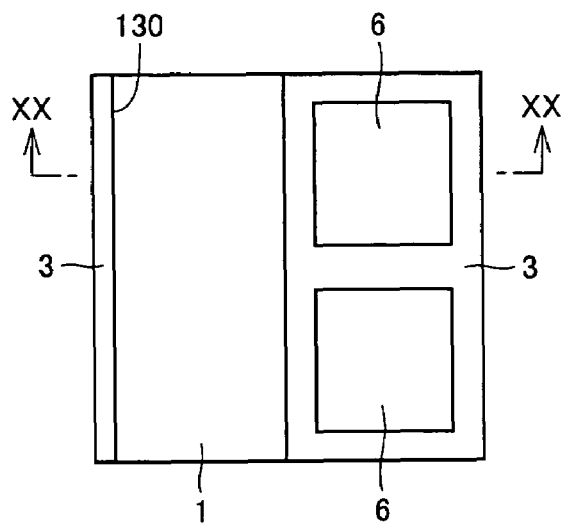
FIG. 21 is a top view of the concave substrate of the semiconductor device according to the third embodiment.
Figure 22:
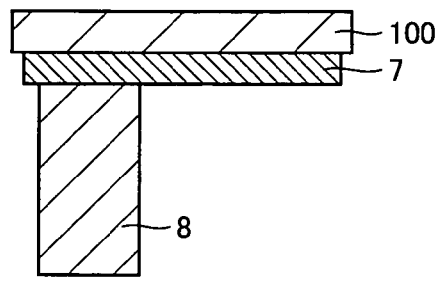
FIG. 22 shows a convex substrate of the semiconductor device according to the third embodiment, which is a cross-sectional view taken along the line XXII-XXII in FIG. 23.
Figure 23:
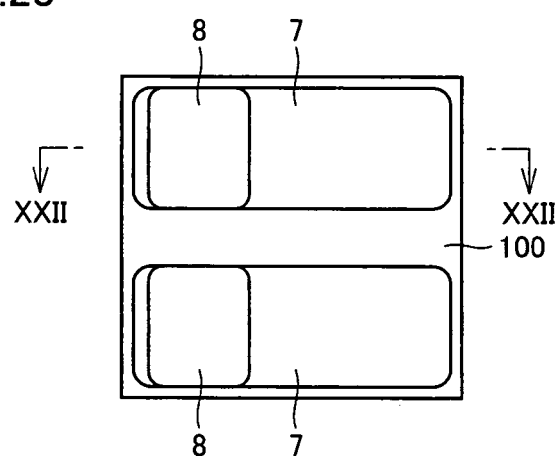
FIG. 23 is a bottom view of the convex substrate of the semiconductor device according to the third embodiment.
Figure 24:
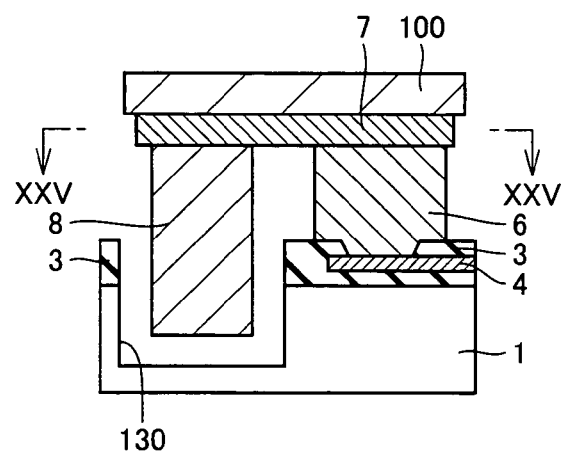
FIG. 24 shows a state in which the concave and convex substrates of the semiconductor device according to the third embodiment are fitted with each other, which is a cross-sectional view taken along the line XXIV-XXIV in FIG. 25.
Figure 25:
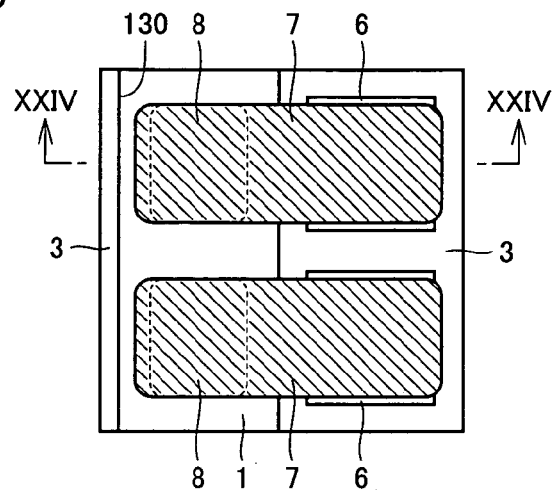
FIG. 25 shows the state in which the concave and convex substrates of the semiconductor device according to the third embodiment are fitted with each other, which is a cross-sectional view taken along the line XXV-XXV in FIG. 24.
Figure 26:
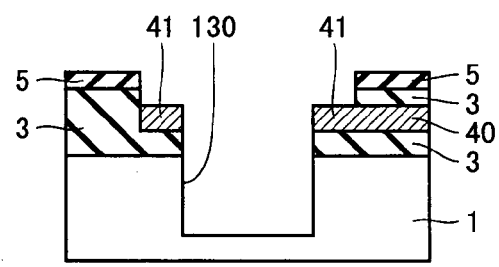
FIG. 26 shows a concave substrate of a semiconductor device according to a fourth embodiment, which is a cross-sectional view taken along the line XXVI-XXVI in FIG. 27.
Figure 27:
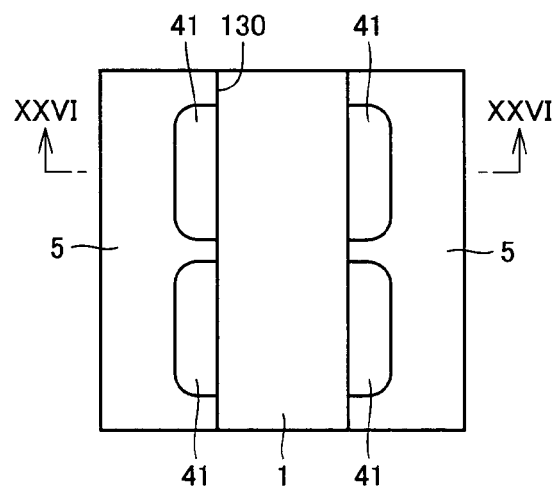
FIG. 27 is a top view of the concave substrate of the semiconductor device according to the fourth embodiment.
Figure 28:
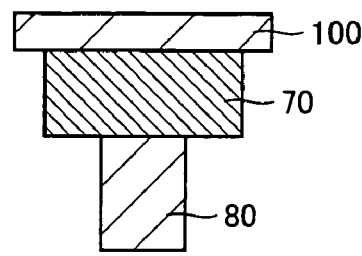
FIG. 28 shows a convex substrate of the semiconductor device according to the fourth embodiment, which is a cross-sectional view taken along the line XXVIII-XXVIII in FIG. 29.
Figure 29:
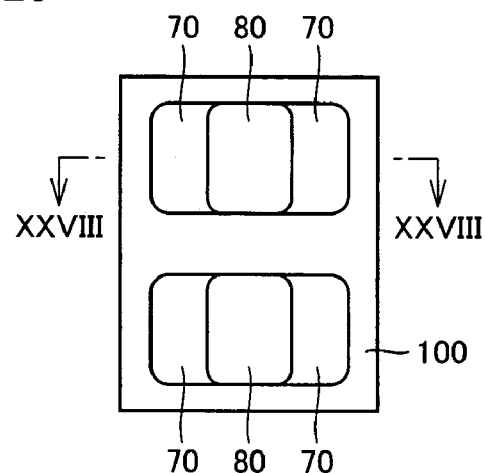
FIG. 29 is a bottom view of the convex substrate of the semiconductor device according to the fourth embodiment.
Figure 30:
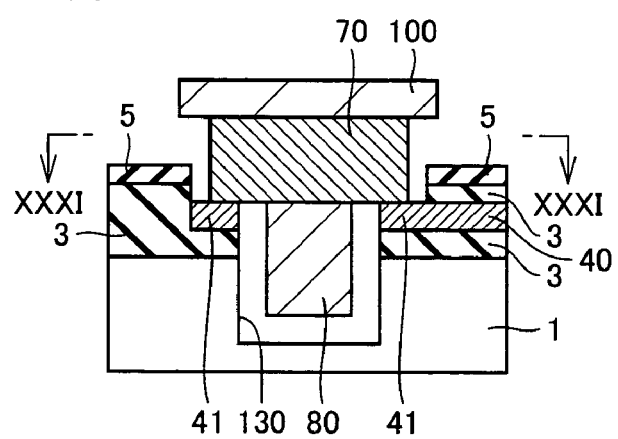
FIG. 30 shows a state in which the concave and convex substrates of the semiconductor device according to the fourth embodiment are fitted with each other, which is a cross-sectional view taken along the line XXX-XXX in FIG. 31.
Figure 31:
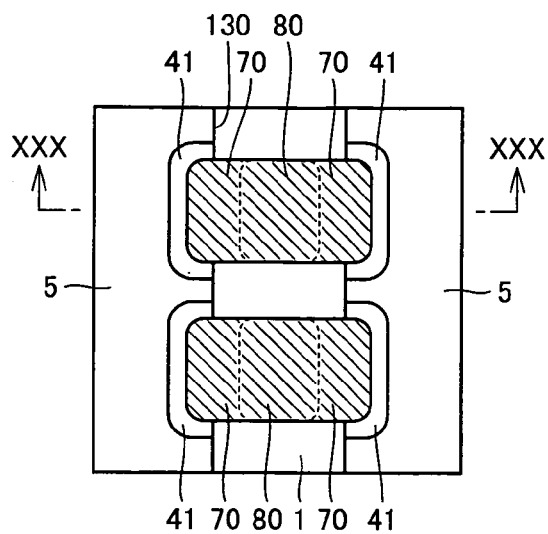
FIG. 31 shows the state in which the concave and convex substrates of the semiconductor device according to the fourth embodiment are fitted with each other, which is a cross-sectional view taken along the line XXXI-XXXI in FIG. 30.

Thereafter, similarly as in the first embodiment, semiconductor substrate 1 is polished from a back surface thereof to a prescribed height position to expose a bottom surface of columnar conductive portion 80 on the back surface of semiconductor substrate 1. In addition, metal plate 100 is removed by etching to expose conductive portion 70 on a surface of insulation film 5. As a result, a structure as shown in FIG. 19 is obtained.

It is to be noted that, though both of aforementioned insulating materials 5a and 5b are used in this embodiment, the semiconductor device according to this embodiment can be manufactured using only one of the insulating materials.

With the method of manufacturing the semiconductor device in this embodiment as described above, effects similar to those obtained with the method according to the first embodiment can be obtained.

In addition, according to the semiconductor device of this embodiment, when the concave and convex substrates are fitted with each other as shown in FIG. 17, a positional relation between the concave and convex substrates is fixed by contact of connection portion 41 with conductive portion 70. Therefore, as compared with the method of manufacturing the semiconductor device in the first embodiment as shown in FIG. 6, in which the positional relation between the concave and convex substrates are fixed by contact between bump 6 and conductive portion 7, the positional relation between the concave and convex substrates, in particular, a positional relation between hole 13 and columnar conductive portion 80 can be made proper easily.

It is to be noted that, if surface processing is performed to a lower surface of conductive portion 7 and an upper surface of connection portion 41 of internal interconnection 40, a good condition of contact therebetween is attained. In addition, the method is also employed in this embodiment in which the concave substrate is fitted with the convex substrate with the fluid insulating materials applied on joint surfaces of the convex and concave substrates. The semiconductor device having the structure as shown in FIG. 9, however, can be manufactured by a method in which conductive portion 70 is brought into contact with connection portion 41 while a clearance is left between the concave and convex substrates and a fluid insulating material is injected into the clearance.

Third Embodiment

A structure of a semiconductor device according to a third embodiment will now be described using FIGS. 20-25.

The semiconductor device according to this embodiment has a structure similar to that of the semiconductor device according to the first embodiment. The structure of the semiconductor device of this embodiment is different from that of the first embodiment in that, a groove 130 is formed in place of hole 13. That is, groove 130 is formed in insulation film 3 and semiconductor substrate 1. Furthermore, in this embodiment, a plurality of columnar conductive portions 8 are provided so as to align in groove 130 in an extending direction of groove 130.

As is seen from FIGS. 20-25, according to the structure of the semiconductor device of this embodiment, not semiconductor substrate 1 but only insulation film 5 exists between columnar conductive portions 8. In other words, insulating materials 5a and 5b fill a portion between columnar conductive portions 8 inside groove 130.

With this, a thickness of insulation film 5 between columnar conductive portions 8 can be made large even when a spacing between columnar conductive portions 8 is decreased, which attains a desired insulation property. Therefore, size reduction of the semiconductor device is allowed. In addition, accuracy of alignment of columnar conductive portions 8 is relaxed and insulating materials 5a and 5b can flow more easily. As a result, materials having high viscosity can be used as insulating materials 5a and 5b. Therefore, a range of selection of the insulating material is extended.

It is to be noted that, in this embodiment, the method may be employed in which the concave substrate is fitted with the convex substrate with the fluid insulating materials applied on joint surfaces of the convex and concave substrates. Alternatively, the method may be employed in which the concave and convex substrates are fitted with each other while a clearance is left therebetween, and a fluid insulating material is injected into the clearance.

In a method of manufacturing the semiconductor device according to this embodiment, finally the back surface of semiconductor substrate 1 is removed to expose a back surface of columnar conductive portion 8 and, thereafter, metal plate 100 is removed to expose conductive portion 7, similarly as in the method in the first embodiment.

Fourth Embodiment

A structure of a semiconductor device according to this embodiment will now be described using FIGS. 26-31.

The semiconductor device according to this embodiment has a structure similar to that of the semiconductor device according to the second embodiment. The structure of the semiconductor device of this embodiment is different from that of the second embodiment in that, groove 130 is formed in place of hole 13. That is, groove 130 is formed in insulation film 3 and semiconductor substrate 1. Furthermore, in this embodiment, a plurality of columnar conductive portions 80 are formed so as to align in an extending direction of groove 130. That is, a plurality of columnar conductive portions 80 in an aligned form are provided in groove 130.

With the semiconductor device of this embodiment, a spacing between columnar conductive portions 80 can be made as small as possible, similarly as with the semiconductor device of the third embodiment. Therefore, size reduction of the semiconductor device is allowed.

It is to be noted that, in this embodiment, the method may be employed in which the concave substrate is fitted with the convex substrate with the fluid insulating materials applied on joint surfaces of the convex and concave substrates. Alternatively, the method may be employed in which the concave and convex substrates are fitted with each other while a clearance is left therebetween, and a fluid insulating material is injected into the clearance.

Furthermore, in a method of manufacturing the semiconductor device according to this embodiment, finally the back surface of semiconductor substrate 1 is removed to expose a back surface of columnar conductive portion 80 and, thereafter, metal plate 100 is removed to expose conductive portion 70, similarly as in the method in the second embodiment.

Fifth Embodiment

A semiconductor device according to a fifth embodiment will now be described using FIG. 32.

The semiconductor device according to this embodiment has a structure similar to that of the semiconductor device according to the first embodiment. The structure of the semiconductor device of this embodiment, however, is different from that of the first embodiment shown in FIG. 1 in that, a bump 9 is provided on conductive portion 7. According to the structure as such, since bump 9 is projecting from a main surface of insulation film 5, electrical connection of conductive portion 7 not only with another semiconductor substrate or semiconductor device but also with another equipment is improved.

Figure 32:
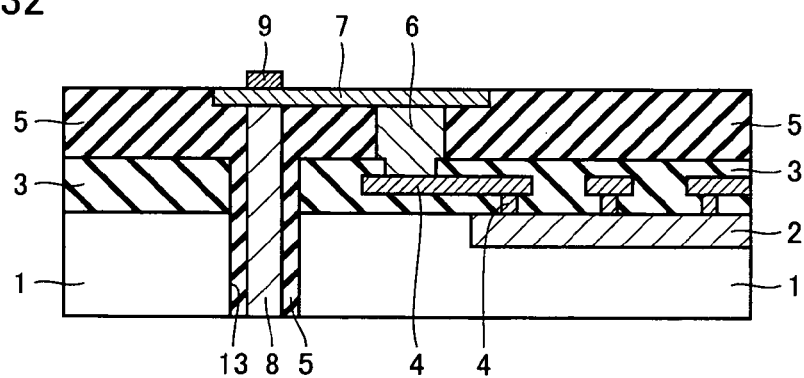
FIG. 32 shows a structure of a semiconductor device according to a fifth embodiment.
Figure 33:
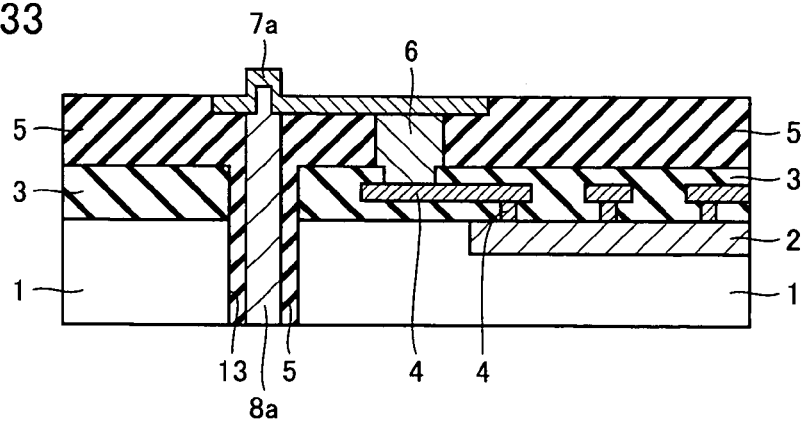
FIGS. 33-39 respectively show semiconductor devices according to modified examples 1-7 of the fifth embodiment.

In addition, as a modified example of the structure of the semiconductor device of this embodiment, a structure may be adopted in which, in place of bump 9 shown in FIG. 32, a columnar conductive portion 8a having a partially projecting upper portion is used and a conductive portion 7a is provided along a form of the projecting upper portion, as shown in FIG. 33. That is, a structure may be adopted in which an upper portion of conductive portion 7a is projecting from the main surface of insulation film 5. With the structure shown in FIG. 33, electrical connection of conductive portion 7a with another semiconductor substrate, semiconductor device or equipment is also improved similarly as with the structure having bump 9 shown in FIG. 32.

Figure 34:
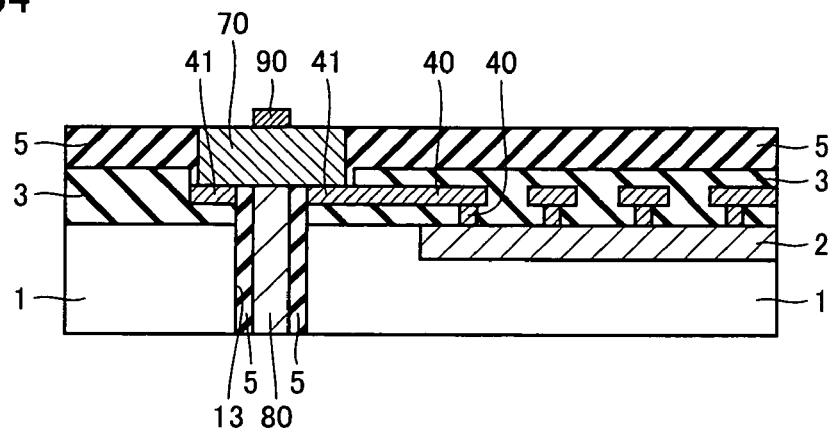
Figure 35:
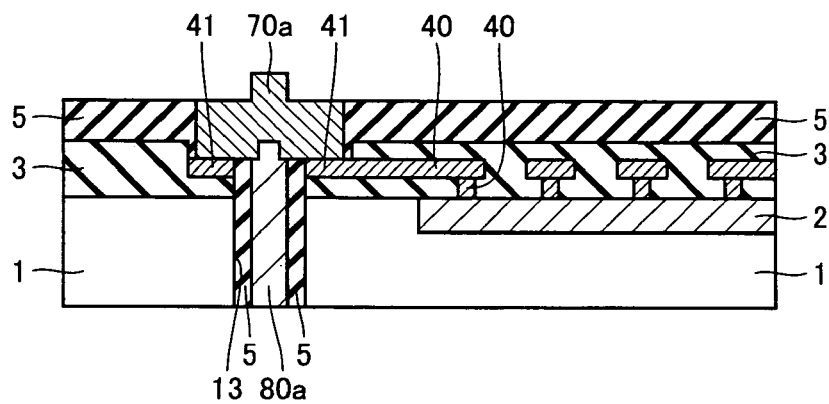

In addition, structures as shown in FIGS. 34 and 35 are also envisaged as other modified examples of the structure of the semiconductor device of this embodiment. The structure shown in FIG. 34 is similar to that of the semiconductor device according to the second embodiment shown in FIG. 2. The structure shown in FIG. 34, however, is different from that shown in FIG. 2 in that, a bump 90 is formed on conductive portion 70. An effect similar to that obtained with bump 9 shown in FIG. 32 can also be obtained with bump 90.

In addition, as shown in FIG. 35, a conductive portion 70a similar to conductive portion 70 shown in FIG. 10 but having a projecting upper surface may be provided in place of bump 90 shown in FIG. 34. In this situation, a columnar conductive portion 80a has a partially projecting upper portion, as shown in FIG. 35. That is, conductive portion 70a is formed along a form of columnar conductive portion 80a.

Figure 36:
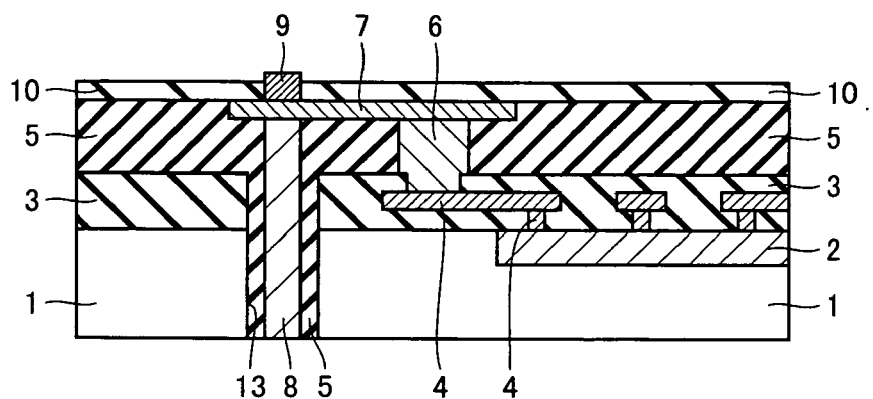

In the semiconductor device of this embodiment, in addition to the structure shown in FIG. 32, a protection film 10 made of glass or an organic material may be formed on insulation film 5 and conductive portion 7, as shown in FIG. 36. That is, protection film 10 is formed on a region other than a region in which bump 9 is formed. According to this structure, main surfaces of insulation film 5 and conductive portion 7 are protected with protection film 10. In addition, since protection film 10 is not provided on bump 9 and bump 9 is projecting from a main surface of protection film 10, electrical connection of conductive portion 7 with another semiconductor substrate, semiconductor device or equipment is not inhibited by protection film 10.

Figure 37:
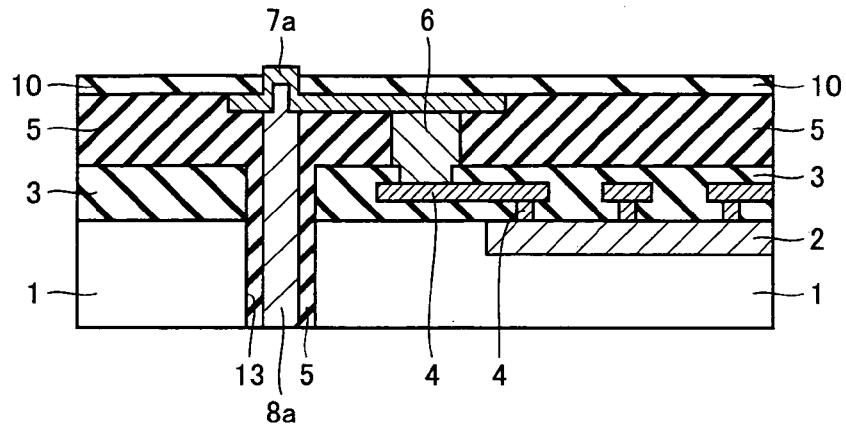
Figure 38:
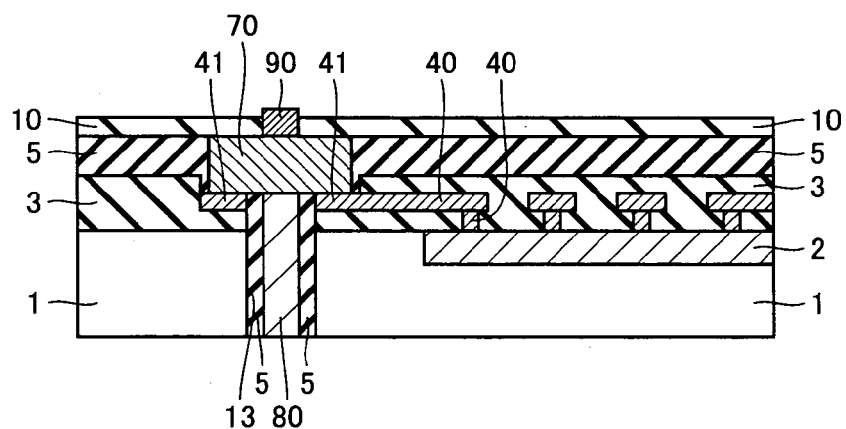
Figure 39:
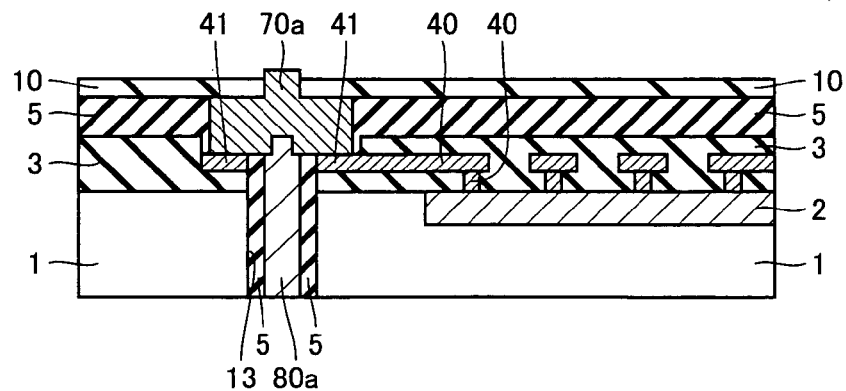

In addition, as shown in FIG. 37, protection film 10 described above may be used as a protection film for the structure shown in FIG. 33 having columnar conductive portion 8a and conductive portion 7a. That is, protection film 10 may be provided not to cover a projecting portion of conductive portion 7a but to cover the other portion of conductive portion 7a and insulation film 5, as shown in FIG. 37. In this situation, the projecting portion is projecting from the main surface of protection film 10. In addition, as shown in FIG. 38, protection film 10 may be added to the structure shown in FIG. 34. In a structure shown in FIG. 38, bump 90 is projecting from the main surface of protection film 10. In addition, as shown in FIG. 39, protection film 10 may be added to the structure shown in FIG. 35. In a structure shown in FIG. 39, a projecting portion of conductive portion 70a is projecting from the main surface of protection film 10.

A method of manufacturing the semiconductor device of this embodiment having a structure as shown in FIG. 36 will now be described using FIGS. 40-45.

Figure 40:
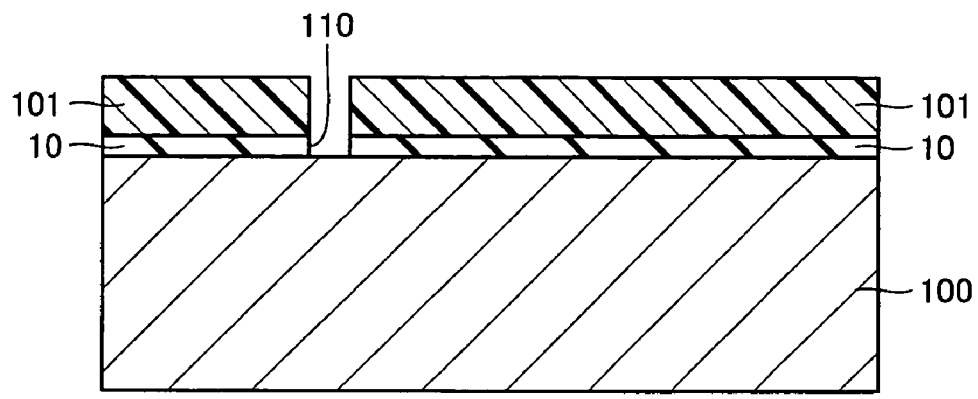
FIGS. 40-45 are views for describing a method of manufacturing the semiconductor device according to the fifth embodiment shown in FIG. 36.
Figure 41:
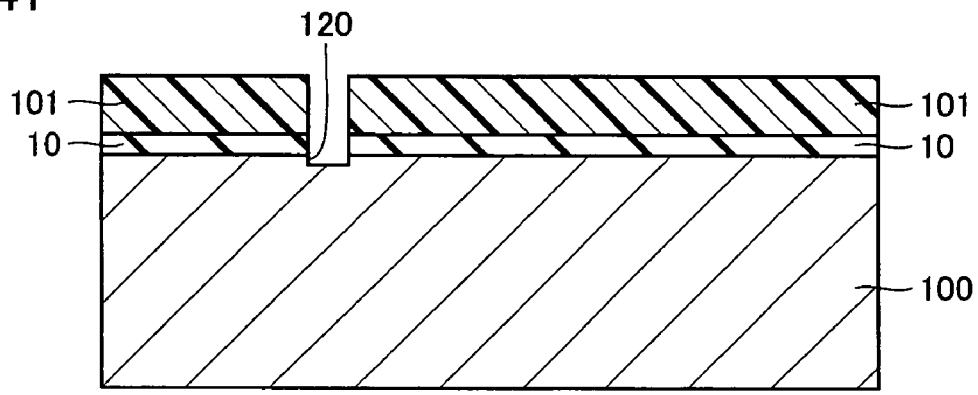

First, protection film 10 made of glass or an organic material is formed with CVD (chemical vapor deposition) or spin coating on metal plate 100 made of a material such as aluminum. Then, resist film 101 is formed on protection film 10. Thereafter, a hole 110 is formed to penetrate through resist film 101 and protection film 10 and expose metal plate 100. As a result, a structure as shown in FIG. 40 is obtained. Then, metal plate 100 is further etched to form a hole 120. Resist film 101 is then removed. As a result, a structure as shown in FIG. 41 is obtained.

Figure 42:
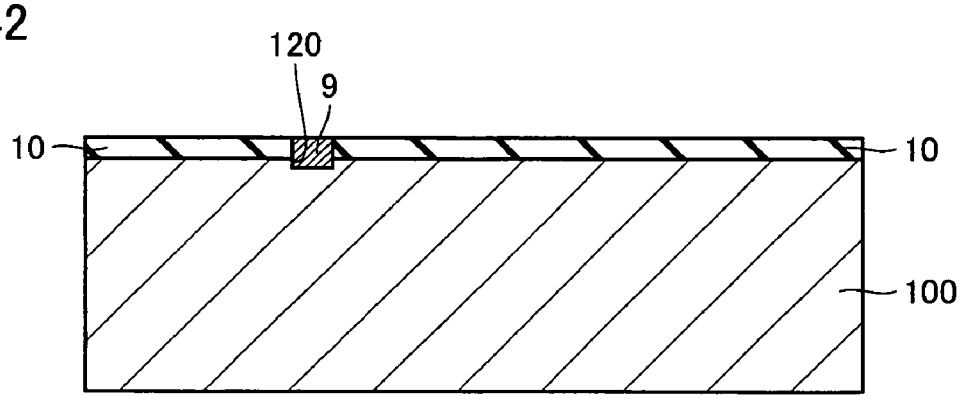
Figure 43:
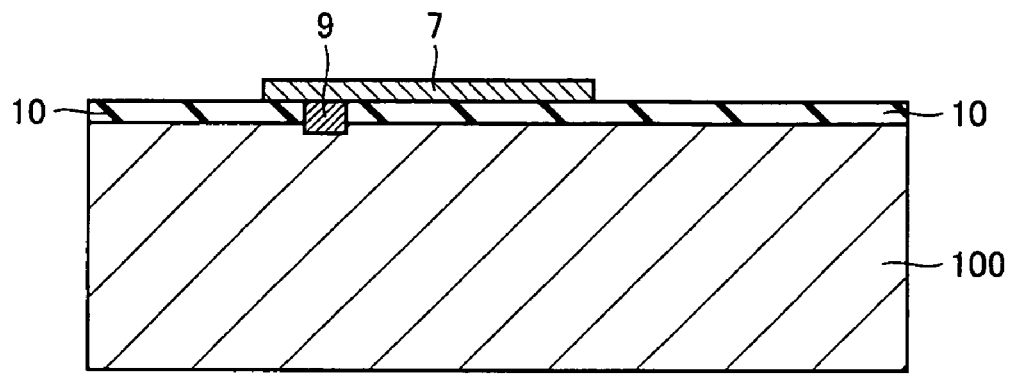
Figure 44:
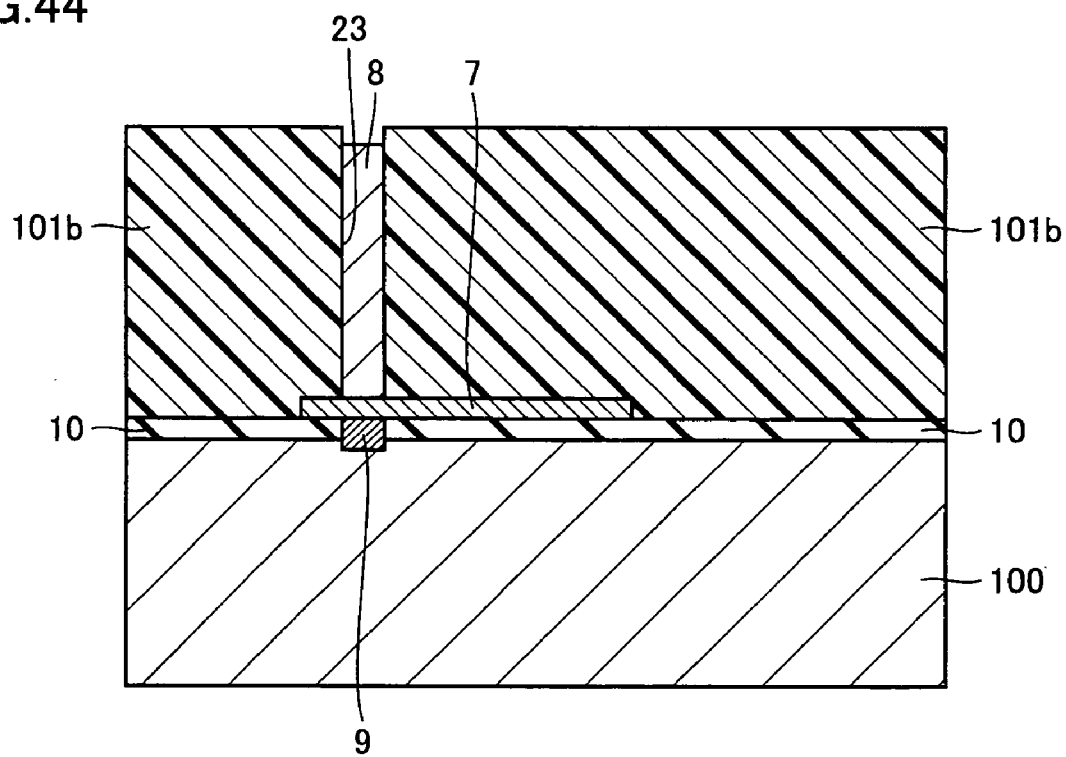

Next, bump 9 made of a material other than aluminum such as gold is formed by electroplating using metal plate 100 as a cathode to fill a lower portion of hole 120 formed in protection film 10 and metal plate 100. As a result, a structure as shown in FIG. 42 is obtained. Then, conductive portion 7 is deposited along a portion of a surface of protection film 10 and connected to bump 9. As a result, a structure as shown in FIG. 43 is obtained. It is to be noted that, the step of depositing conductive portion 7 may be carried out before or after the step of forming hole 120. In addition, conductive portion 7 may be formed with a method other than deposition, that is, bonding of gold foil, electroless plating, electroplating, or a combination of deposition and plating.

Figure 45:
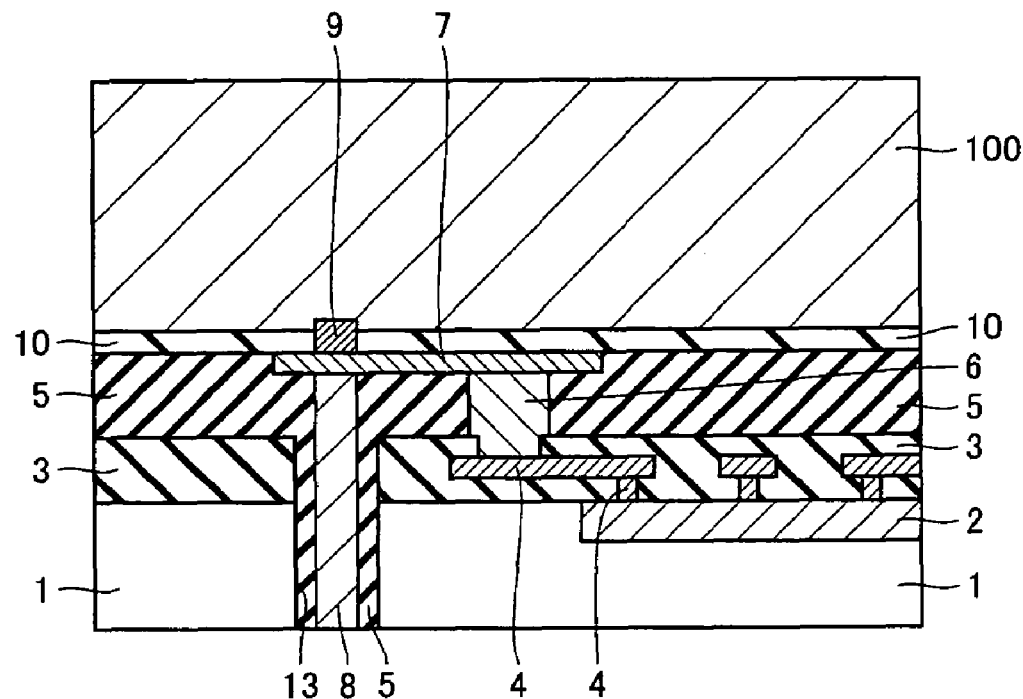

Then, resist film 101b is formed to bury conductive portion 7 and protection film 10. Thereafter, a hole 23 is formed to penetrate through resist film 101b in a direction of a thickness thereof and expose conductive portion 7. Columnar conductive portion 8 is formed in hole 23. Thereafter, resist film 101b is removed. Then, the convex substrate is fitted into the concave substrate and a space between the convex and concave substrates is filled using the fluid insulating material. Thereafter, a back surface of the concave substrate is polished. A resulting structure is shown in FIG. 45. Then, metal plate 100 is removed by etching. As a result, the structure as shown in FIG. 36 is obtained.

According to the method described above, since bump 9 is previously formed on conductive portion 7, reduction in yield due to cracking of the semiconductor device can be suppressed as compared with a method of forming bump 9 on conductive portion 7 of the semiconductor device which is made thinner by removing of metal plate 100. In addition, since metal plate 100 is removed while protection film 10 is provided on insulation film 5, removing of metal plate 100 by etching can be performed easily.

Figure 46:
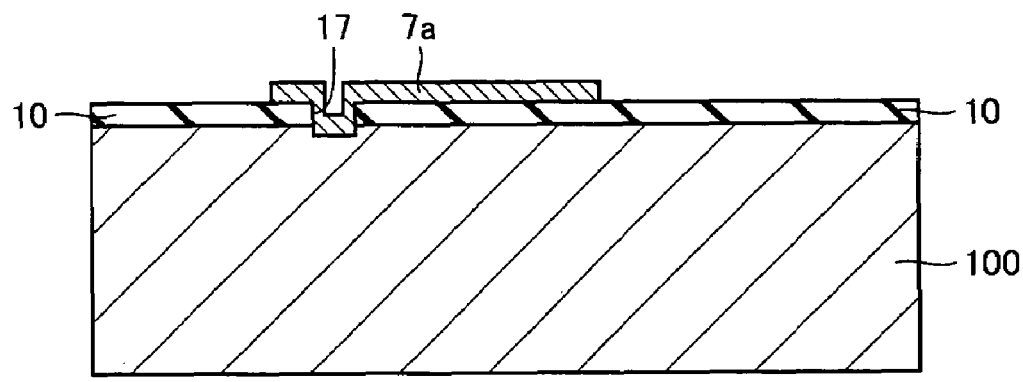
FIGS. 46-48 are views for describing a method of manufacturing the semiconductor device according to the fifth embodiment shown in FIG. 37.
Figure 47:
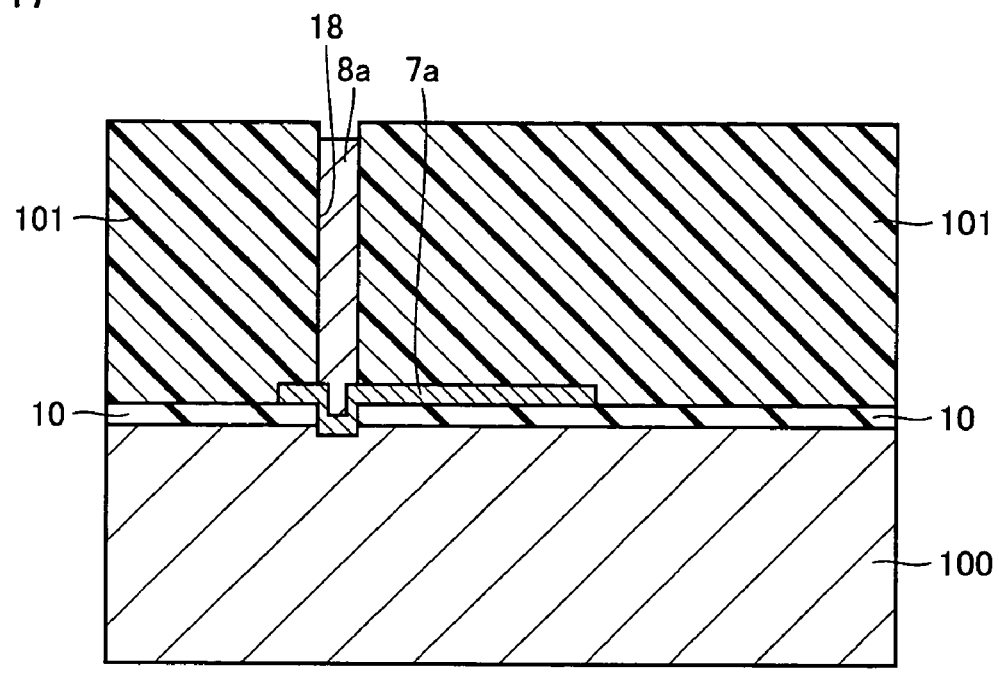
Figure 48:
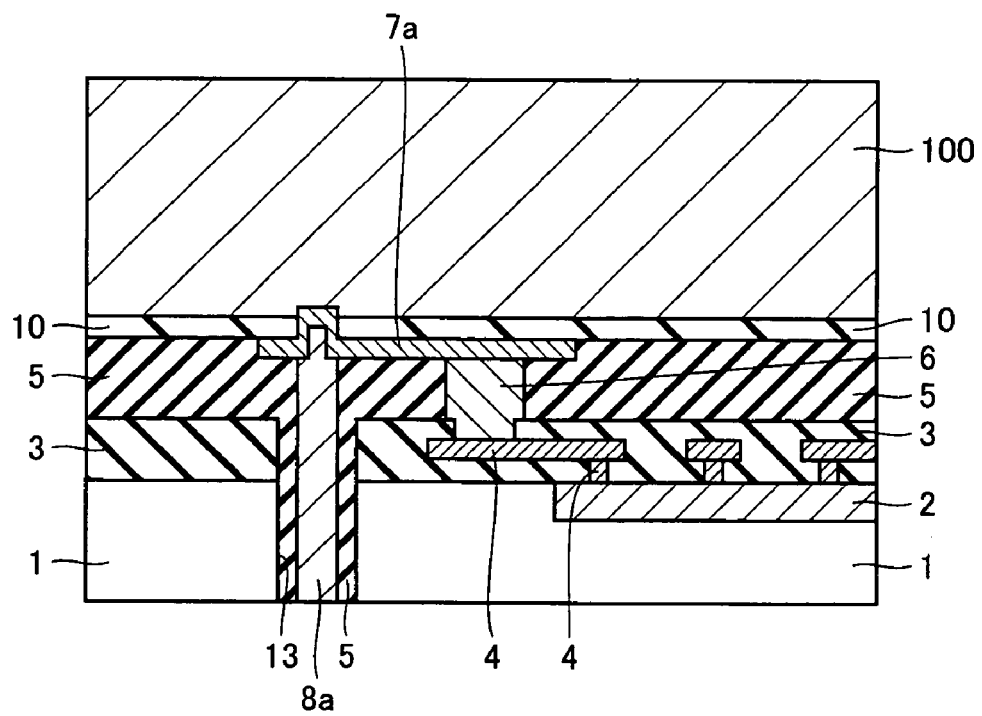

A method of manufacturing the semiconductor device having a structure as shown in FIG. 37 will now be described using FIGS. 46-48.

First, protection film 10 is formed on metal plate 100. A hole 17 is then formed in protection film 10 and metal plate 100. Thereafter, conductive portion 7a is formed along the main surface of protection film 10 and a surface of hole 17. As a result, a structure as shown in FIG. 46 is obtained. Then, resist film 101 is formed to bury conductive portion 7a and protection film 10. Thereafter, a hole 18 is formed to penetrate through resist film 101 in a direction of a thickness thereof and reach a concave portion of conductive portion 7a.

Next, columnar conductive portion 8a is formed in hole 18 by plating. As a result, a structure as shown in FIG. 47 is obtained. Then, resist film 101 is removed. The convex substrate obtained therewith is fitted into the concave substrate. Thereafter, the insulating material is injected into a clearance between the concave and convex substrates. The insulating material is then set. With this, insulation film 5 is formed in a space between the convex and concave substrates. As a result, a structure as shown in FIG. 48 is obtained. Thereafter, metal plate 100 is removed by etching. As a result, the structure as shown in FIG. 37 is obtained.

It is to be noted that, as each columnar conductive portion 8a is formed by electroplating, a metal is automatically embedded in hole 18.

In addition, conductive portion 7a having a projecting portion in the structure shown in FIG. 37 can also be formed by pressing a convex die against a main surface of conductive portion 7a having a plane shape formed on metal plate 100 before protection film 10 is formed.

Sixth Embodiment

A structure of a semiconductor device according to a sixth embodiment will now be described using FIG. 49.

The semiconductor device according to this embodiment has a structure similar to that of the semiconductor device shown in FIG. 1. The semiconductor device of this embodiment, however, is different from the semiconductor device of the first embodiment in that, a bump 11 is formed so as to cover a surface of columnar conductive portion 8 exposed on the back surface of semiconductor substrate 1.

Figure 49:
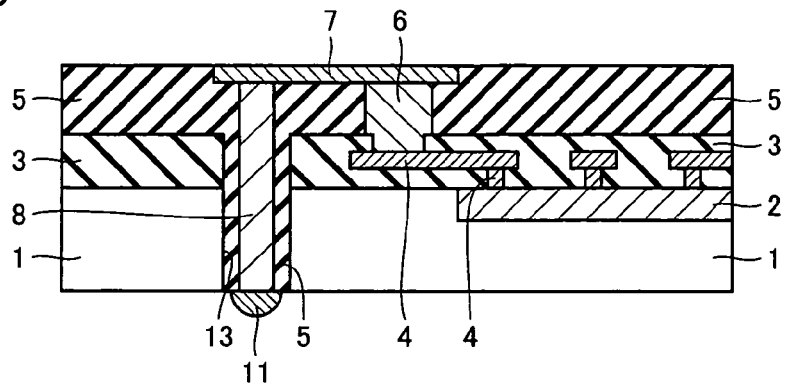
FIG. 49 shows a structure of a semiconductor device according to a sixth embodiment.

According to the structure shown in FIG. 49, since bump 11 is provided, electrical connection of columnar conductive portion 8 with another semiconductor substrate, semiconductor device or equipment connected to the back surface of semiconductor substrate 1 is improved. In addition, manners of connection between the semiconductor device and another equipment or the like can be diversified with the semiconductor device having both of bump 9 in the above-described embodiment and bump 1 in this embodiment.

Figure 50:
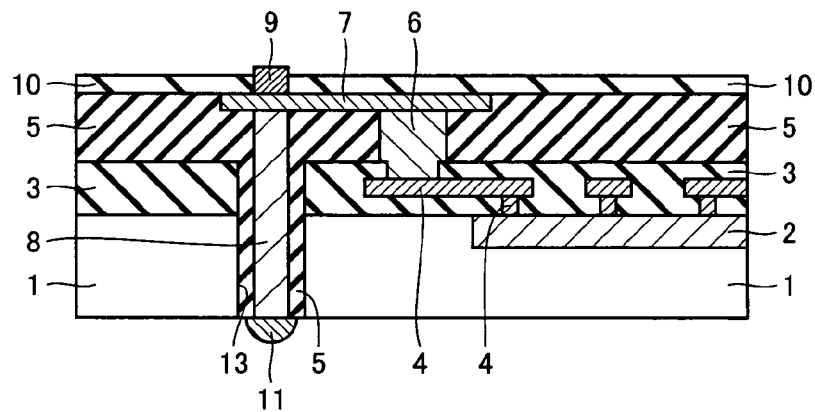
FIG. 50 shows a structure of a semiconductor device according to a modified example of the sixth embodiment.

It is to be noted that, as shown in FIG. 50, bump 11 may be formed so as to cover an exposed surface of columnar conductive portion 8 in the structure shown in FIG. 36.

Figure 51:
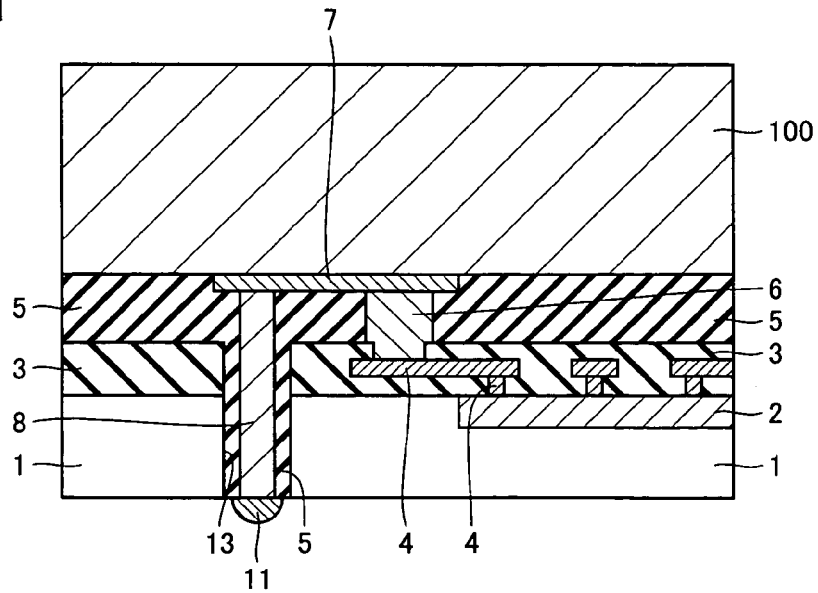
FIG. 51 is a view for describing a method of manufacturing the semiconductor device according to the sixth embodiment.

In a method of manufacturing the semiconductor device having the structure as shown in FIG. 49 described above, the structure as shown in FIG. 8 in the first embodiment is first obtained. Thereafter, as shown in FIG. 51, bump 11 is attached to the exposed surface of columnar conductive portion 8 by electroplating using metal plate 100, conductive portion 7 and columnar conductive portion 8 as a cathode. Thereafter, metal plate 100 is removed by etching. As a result, the structure as shown in FIG. 49 is obtained.

Figure 52:
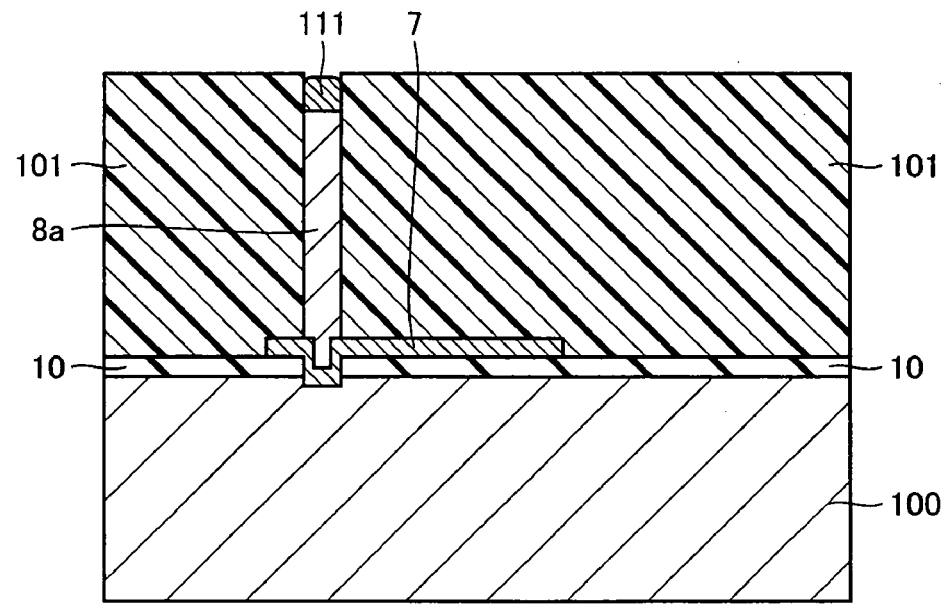
FIGS. 52-56 are views for describing a method of manufacturing the semiconductor device according to the modified example of the sixth embodiment.
Figure 53:
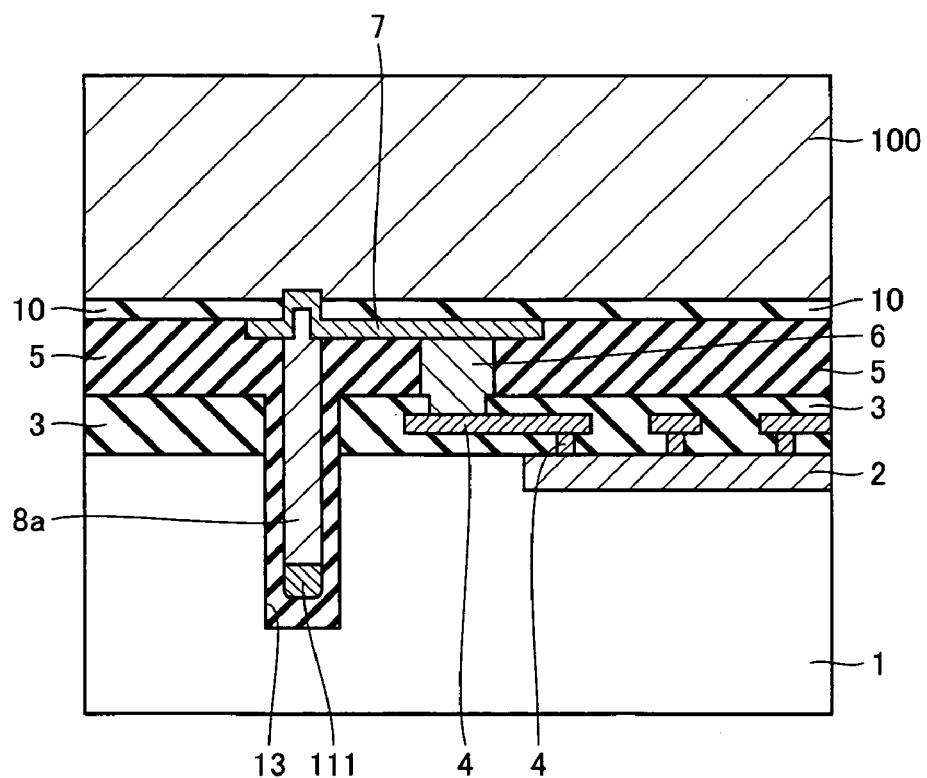
Figure 54:
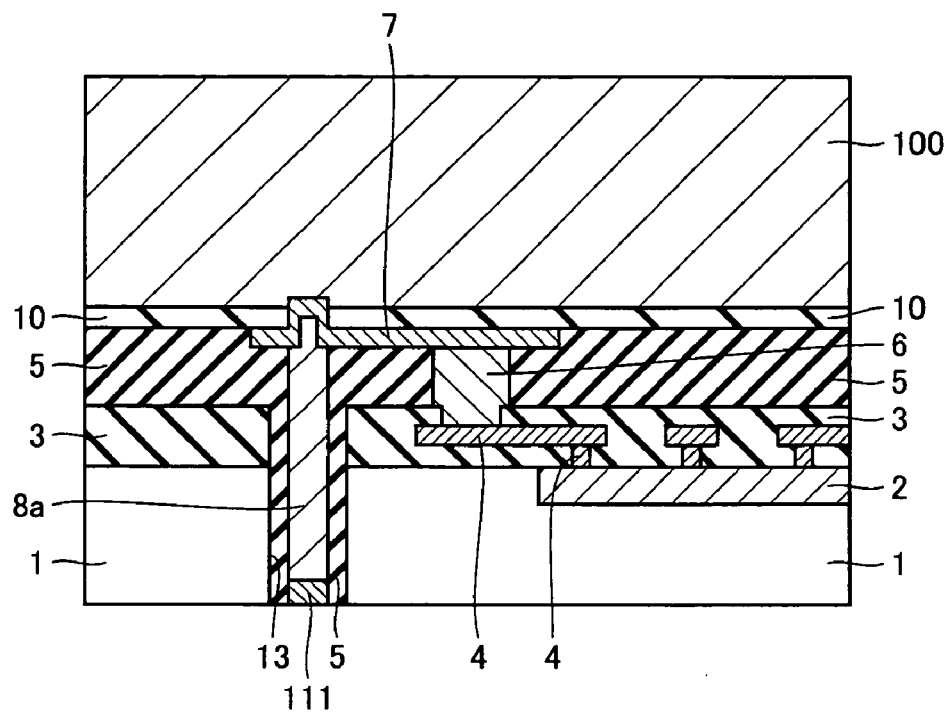
Figure 55:
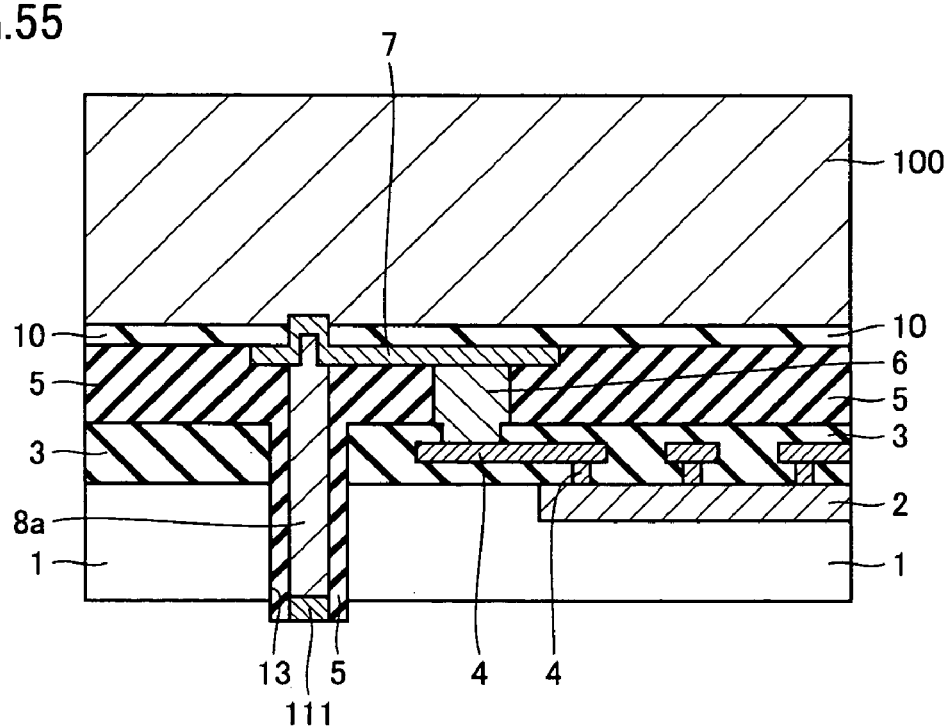
Figure 56:
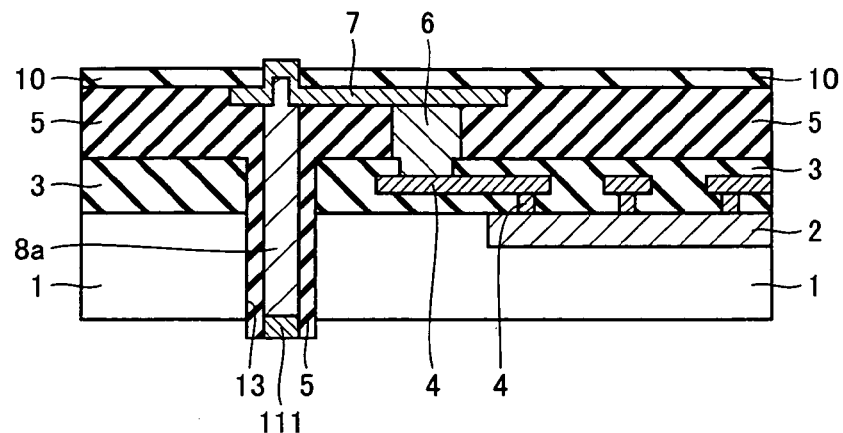

In addition, as a modified example of the method of manufacturing the semiconductor device of this embodiment, a bump 111 may be formed on an upper surface of columnar conductive portion 8a in the step of forming the convex substrate, as shown in FIG. 52. Thereafter, resist film 101 is removed. With this, the convex substrate is obtained. When the convex substrate is fitted into the concave substrate of the first embodiment, a structure as shown in FIG. 53 is obtained. Thereafter, as shown in FIG. 54, bump 111 is exposed by polishing the back surface of semiconductor substrate 1. Furthermore, when the back surface of semiconductor substrate 1 is polished such that bump 111 projects from the back surface of semiconductor substrate 1, a structure as shown in FIG. 55 is obtained. Thereafter, when metal plate 100 is removed by etching, a structure as shown in FIG. 56 is obtained.

It is to be noted that, polishing of the back surface of semiconductor substrate 1 may be stopped when insulation film 5 is exposed. In this situation, only semiconductor substrate 1 is selectively removed by etching in a subsequent step, and thereafter, only insulation film 5 is selectively etched. The structure shown in FIG. 56 can also be obtained with this method.

Seventh Embodiment

Figure 57:
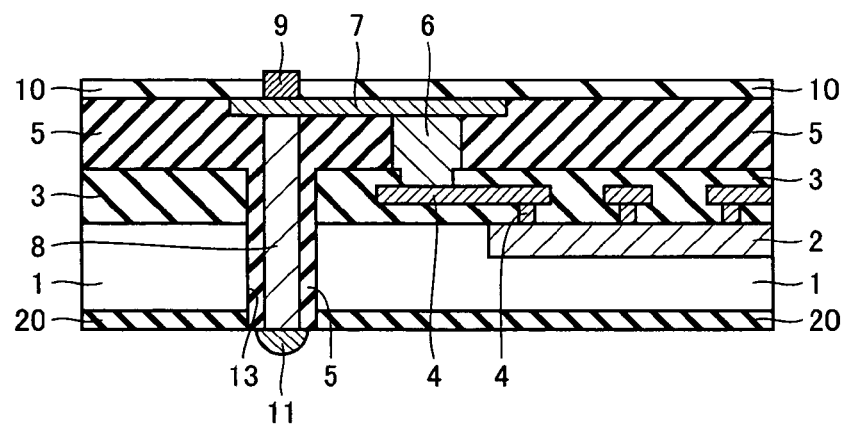
FIG. 57 shows a structure of a semiconductor device according to a seventh embodiment.

A structure of a semiconductor device according to a seventh embodiment will now be described using FIG. 57.

The semiconductor device according to this embodiment has a structure similar to that of the semiconductor device shown in FIG. 50. The semiconductor device of this embodiment, however, is different from that shown in FIG. 50 in that, a protection film 20 is formed on the back surface of semiconductor substrate 1.

Figure 58:
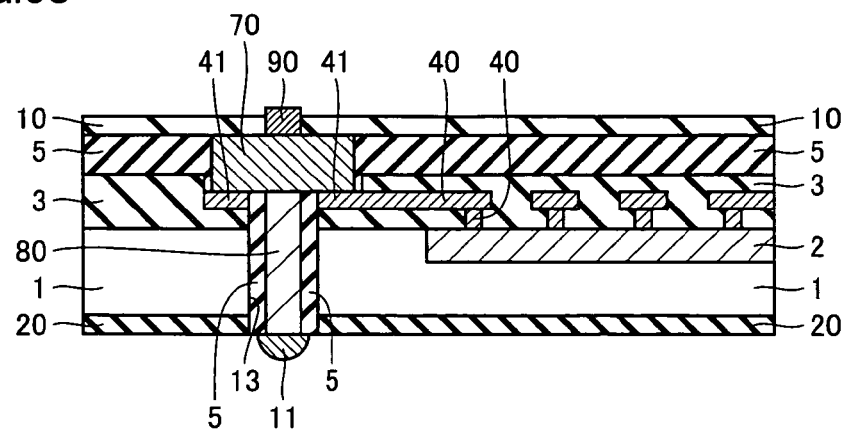
FIG. 58 shows a semiconductor device according to a modified example of the seventh embodiment.

In addition, as a modified example, the semiconductor device of this embodiment may have a structure as shown in FIG. 58. Though the structure shown in FIG. 58 is similar to that shown in FIG. 38, it is different from the structure shown in FIG. 38 in that, protection film 20 is formed on the back surface of semiconductor substrate 1 and bump 11 is formed on an exposed surface of columnar conductive portion 80. With the structure as shown in FIG. 58, the back surface of semiconductor substrate 1 is protected similarly as with the structure shown in FIG. 57.

Eighth Embodiment

A method of manufacturing a semiconductor device according to an eighth embodiment will now be described using FIGS. 59-65.

Figure 59:
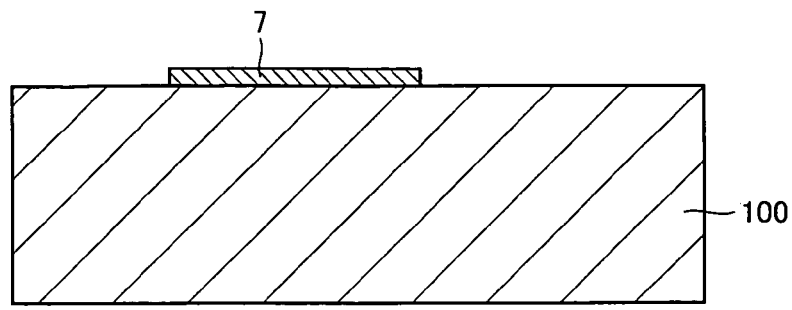
FIGS. 59-65 are views for describing a method of manufacturing a semiconductor device according to an eighth embodiment.
Figure 60:
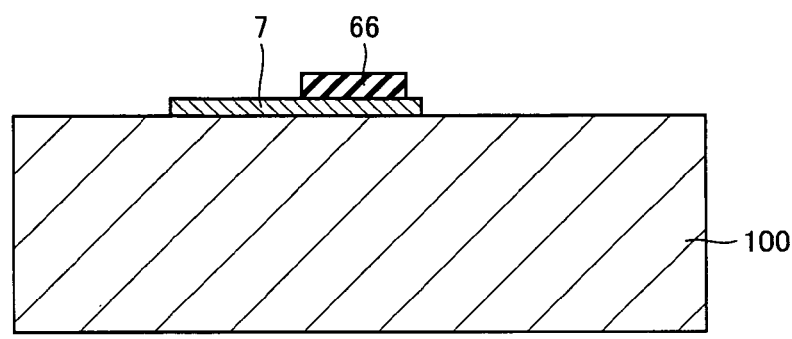

As shown in FIG. 59, conductive portion 7 is formed on metal plate 100. An insulation film 66 is formed on conductive portion 7. As a result, a structure as shown in FIG. 60 is obtained.

Figure 61:
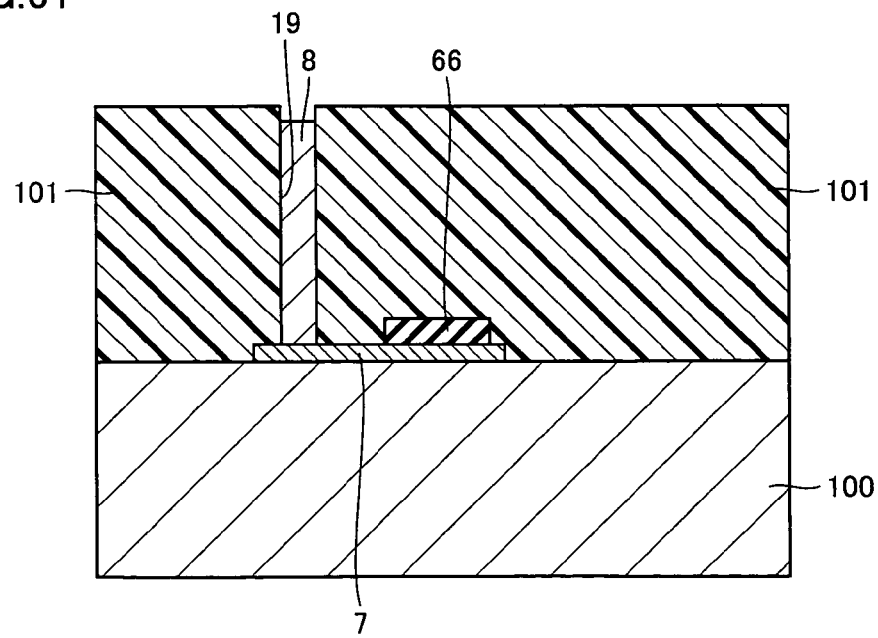
Figure 62:
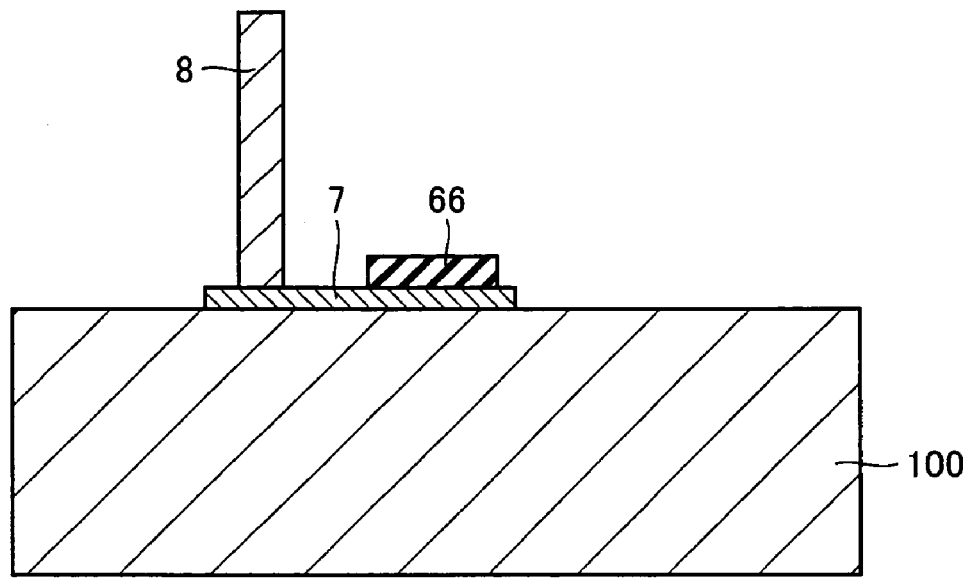

Then, resist film 101 is formed so as to cover conductive portion 7, insulation film 66 and the main surface of metal plate 100. Thereafter, a hole 19 is formed to penetrate through resist film 101 in a direction of a thickness thereof. Columnar conductive portion 8 is formed in hole 19. As a result, a structure as shown in FIG. 61 is obtained. Thereafter, resist film 101 is removed. As a result, a structure as shown in FIG. 62 is obtained.

Figure 63:
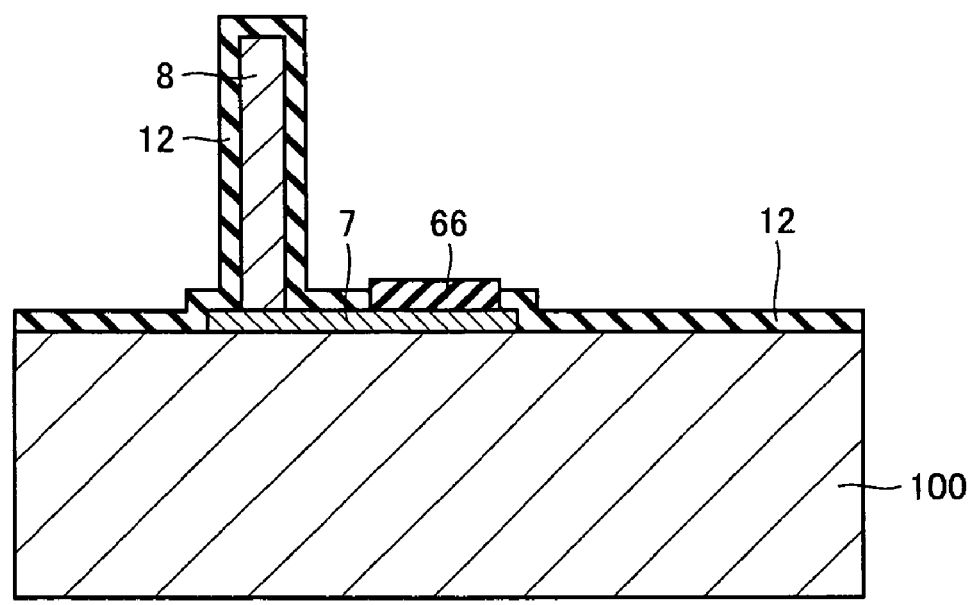

Next, as shown in FIG. 63, an insulation film 12 is formed so as to cover main surfaces other than an upper surface of insulation film 66, that is, the main surface of metal plate 100, an exposed surface of conductive portion 7, either side surface of insulation film 66, and the surface of columnar conductive portion 8. Insulation film 12 is formed with polyimide or the like by electrodeposition using conductive portion 7, metal plate 100 and columnar conductive portion 8 as an electrode.

Figure 64:
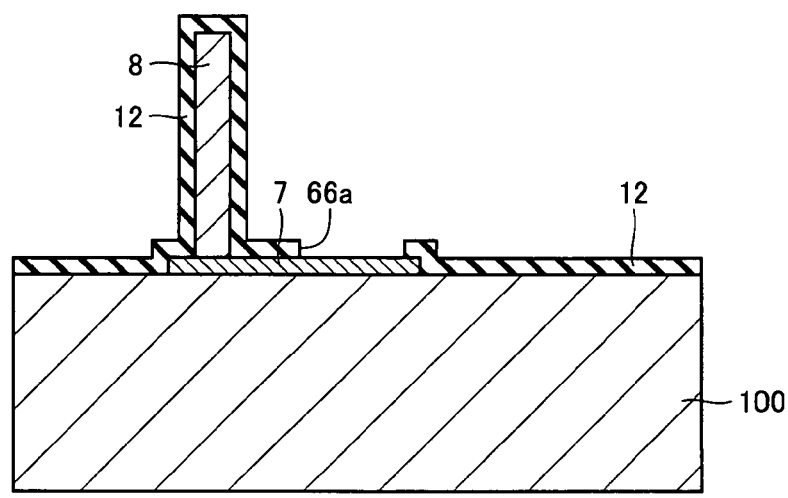

It is to be noted that, in place of performing electrodeposition, exposed surfaces of conductive portion 7 and metal plate 100 may be oxidized using exposed conductive portion 7 and metal plate 100 as an anode, or plating of the exposed surfaces with aluminum or the like may be first performed and then plated surfaces of conductive portion 7, metal plate 100 and columnar conductive portion 8 may be oxidized using exposed conductive portion 7 and metal plate 100 as an anode. Insulation film 66 is then removed. As a result, a structure as shown in FIG. 64 is obtained.

Figure 65:
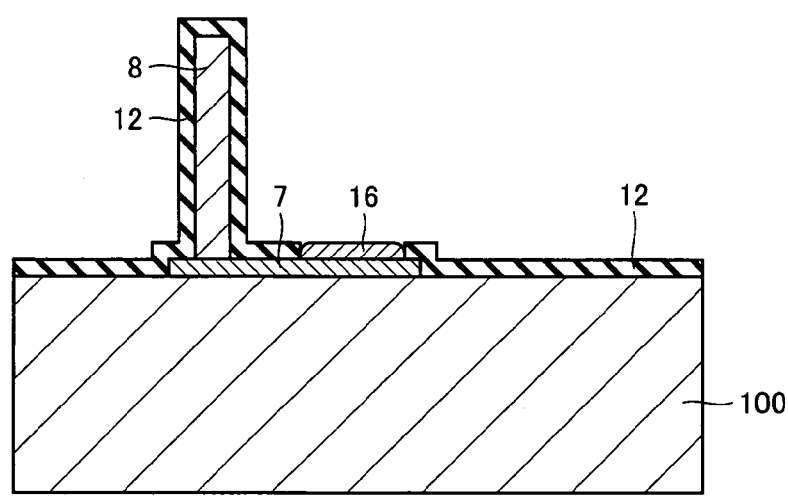
Figure 66:
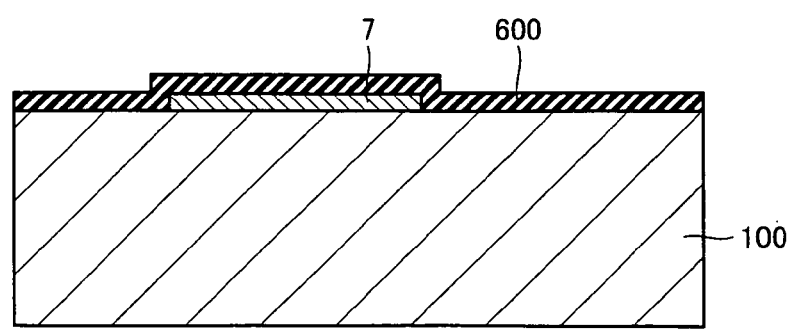
FIGS. 66-71 are views for describing a method of manufacturing a semiconductor device according to a ninth embodiment.

Then, using insulation film 12 as a mask, a conductive binder 16 such as solder is formed in a position of removed insulation film 66, that is, on an exposed surface of conductive portion 7 by electroplating using metal plate 100 and conductive portion 7 as a cathode. It is to be noted that, this step of forming binder 16 can be omitted. As a result, a structure as shown in FIG. 65 is obtained. An effect similar to that obtained with the semiconductor device of the first embodiment can also be obtained with the convex substrate having the structure shown in FIG. 65 fitted into the concave substrate of the first embodiment.

Ninth Embodiment

A method of manufacturing a semiconductor device according to a ninth embodiment will now be described using FIGS. 66-71.

Figure 67:
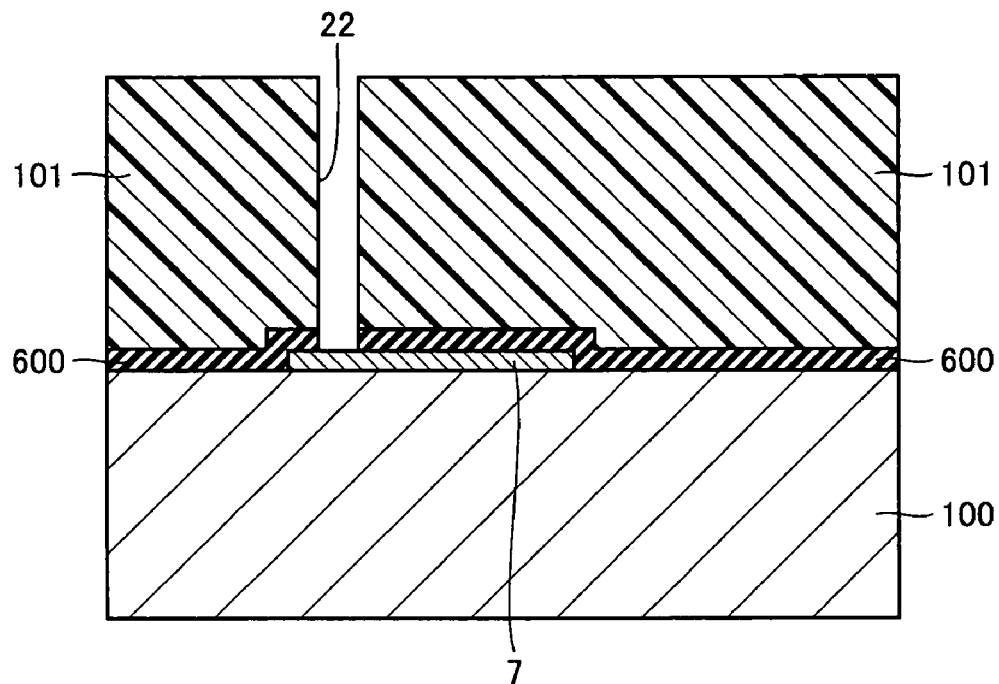

First, conductive portion 7 is formed on metal plate 100. Then, a protection film 600 is formed by electrodeposition so as to cover conductive portion 7 and the surface of metal plate 100. Thereafter, resist film 101 is formed so as to cover a main surface of protection film 600. Then, a hole 22 is formed to penetrate through resist film 101 and protection film 600 in a direction of thicknesses thereof and expose conductive portion 7. A resulting structure is shown in FIG. 67.

Figure 68:
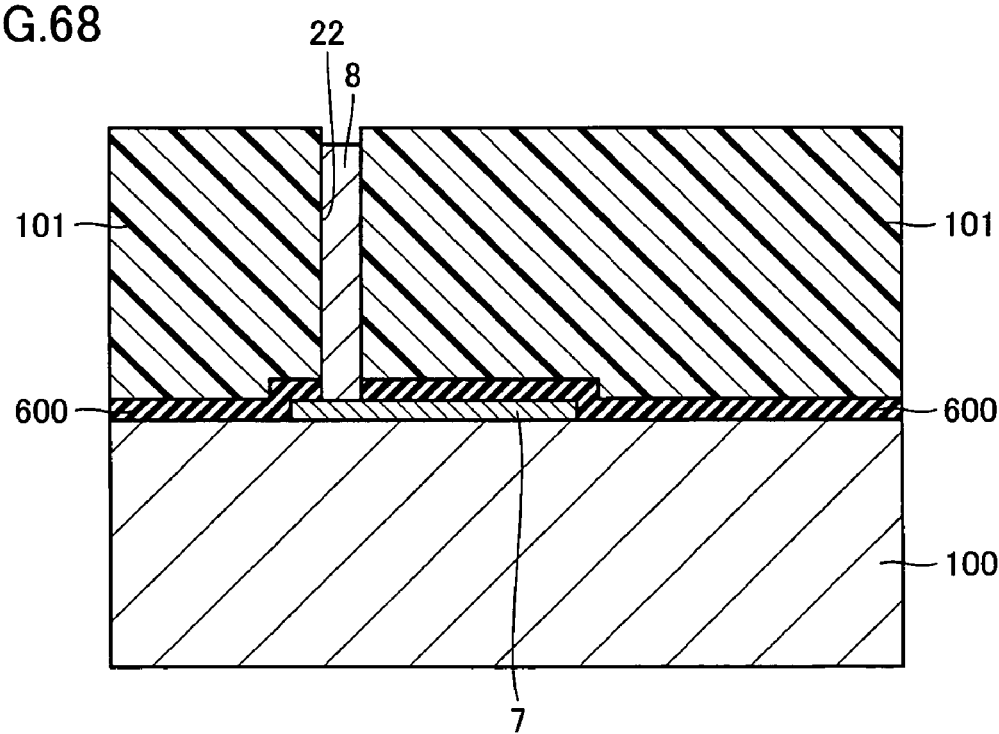
Figure 69:
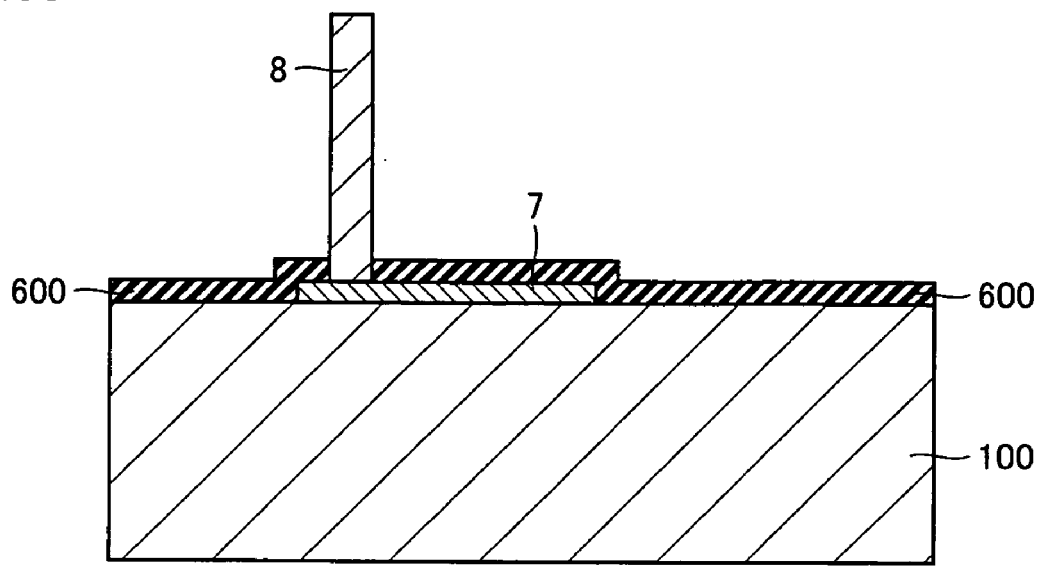
Figure 70:
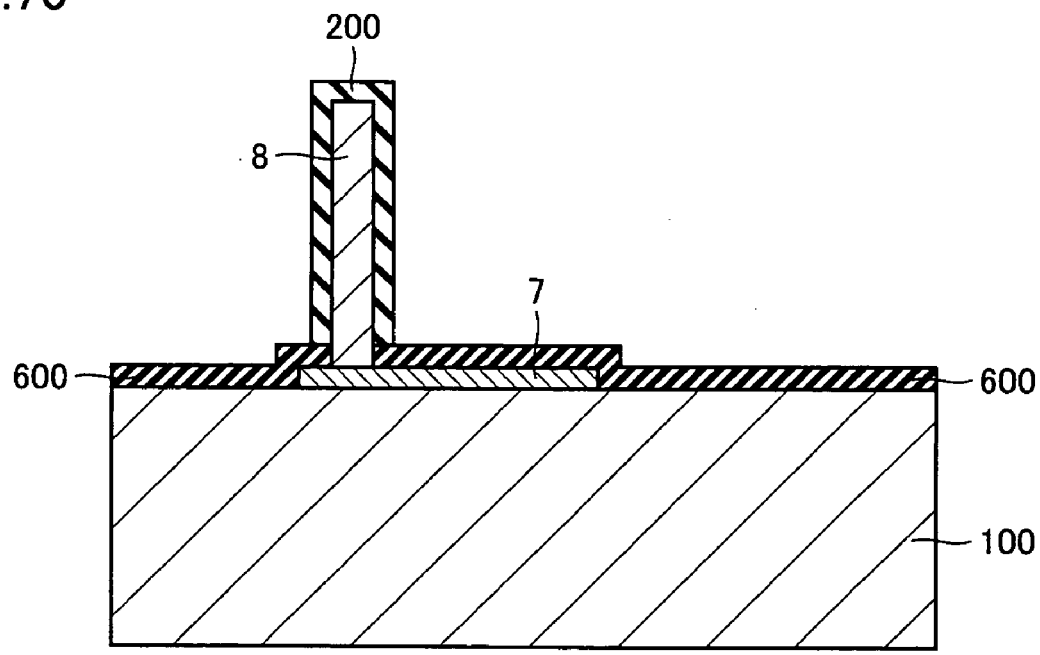

Then, columnar conductive portion 8 is formed in hole 22. A resulting structure is shown in FIG. 68. Thereafter, resist film 101 is removed. A resulting structure is shown in FIG. 69. Then, an insulation film 200 is formed by electrodeposition so as to cover an exposed surface of columnar conductive portion 8. As a result, a structure as shown in FIG. 70 is obtained. Then, protection film 600 is removed. In this step, a portion of protection film 600 is left as a remaining portion 601 near a connection portion between columnar conductive portion 8 and conductive portion 7. A resulting structure is shown in FIG. 71.

Figure 71:
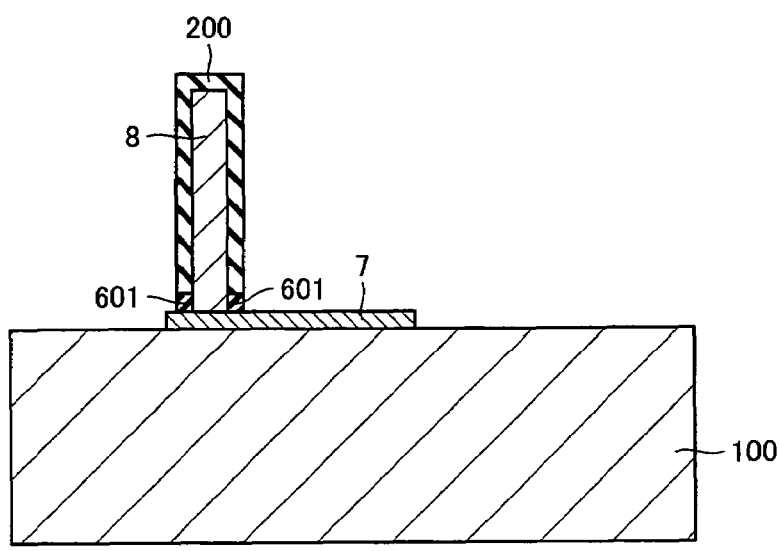

An effect similar to that obtained with the semiconductor device of the first embodiment can also be obtained with the convex substrate shown in FIG. 71 fitted into the concave substrate of the first embodiment.

It is to be noted that, though the aforementioned insulation film 200 and protection film 600 are formed by electrodeposition, in place of performing electrodeposition, exposed surfaces of metal plate 100, conductive portion 70 and columnar conductive portion 8 may be oxidized using metal plate 100, conductive portion 70 and columnar conductive portion 8 as an anode, or plating of the exposed surfaces with aluminum or the like may be first performed and then plated surfaces may be oxidized using plated metal plate 100, conductive portion 70 and columnar conductive portion 8 as an anode.

Tenth Embodiment

A structure of a semiconductor device according to a tenth embodiment will now be described using FIG. 72.

The semiconductor device according to this embodiment has a structure similar to that of the semiconductor device according to the second embodiment. The semiconductor device of this embodiment, however, is different from the semiconductor device of the second embodiment in the following points.

In the semiconductor device according to this embodiment, an insulation film 20b is formed on an outer peripheral surface of columnar conductive portion 80. In addition, bump 11 is formed on an exposed surface of columnar conductive portion 80. Connection portion 41 and conductive portion 70 are joined by a binder 42. In addition, a remaining portion 61 is formed between insulation film 20b and conductive portion 70. An effect similar to that obtained with the semiconductor device according to the second embodiment can also be obtained with the semiconductor device having the structure shown in FIG. 72.

Figure 72:
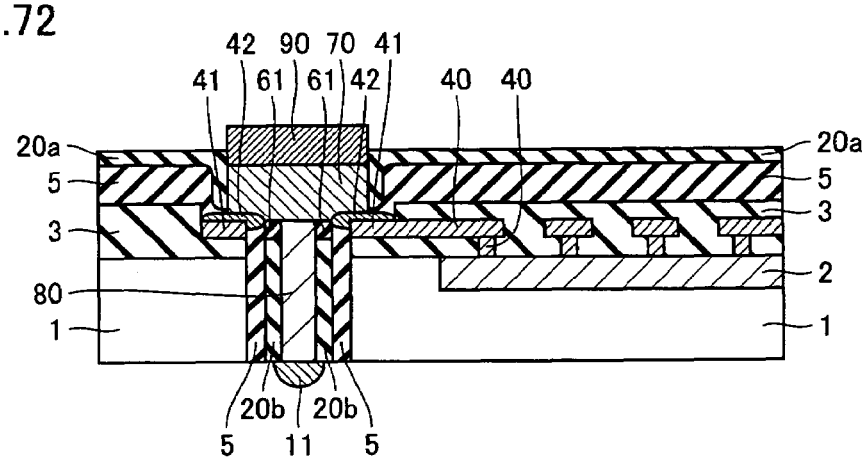
FIG. 72 shows a structure of a semiconductor device according to a tenth embodiment.

A method of manufacturing the semiconductor device of this embodiment as shown in FIG. 72 will now be described.

Figure 73:
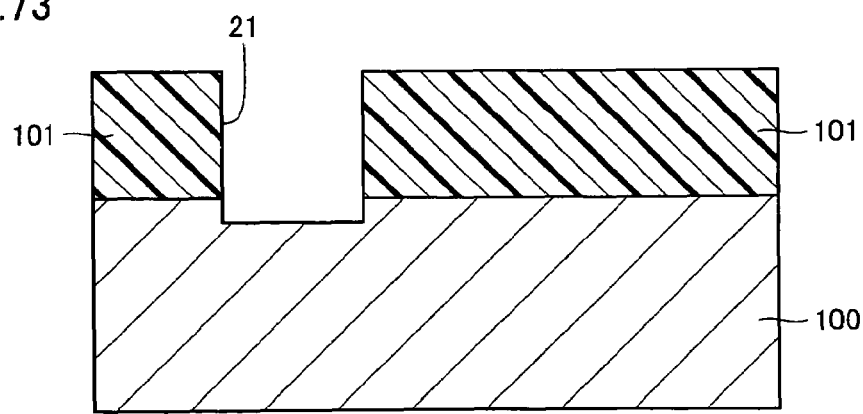
FIGS. 73-83 are views for describing a method of manufacturing the semiconductor device according to the tenth embodiment.
Figure 74:
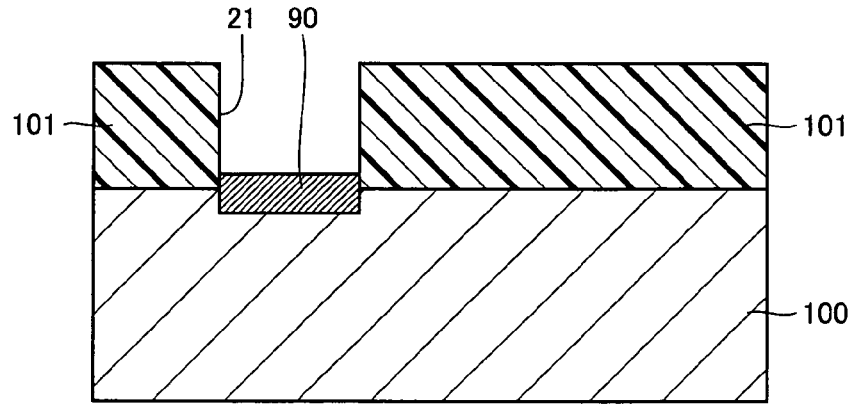
Figure 75:
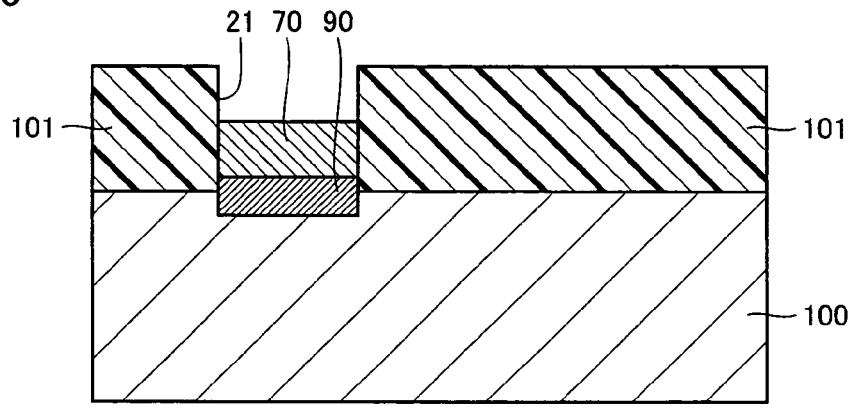
Figure 76:
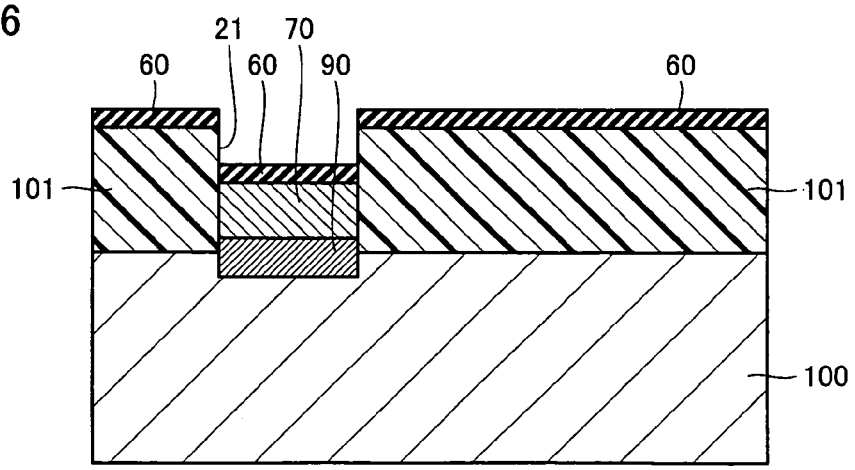

First, resist film 101 is formed on metal plate 100. Then, a hole 21 is formed in resist film 101 and metal plate 100. A resulting structure is shown in FIG. 73. Then, bump 90 is formed so as to cover a bottom surface of hole 21, as shown in FIG. 74. Then, as shown in FIG. 75, conductive portion 70 is formed on bump 90. Then, an insulation film 60 is formed so as to cover upper surfaces of conductive portion 70 and resist film 101, as shown in FIG. 76.

Figure 77:
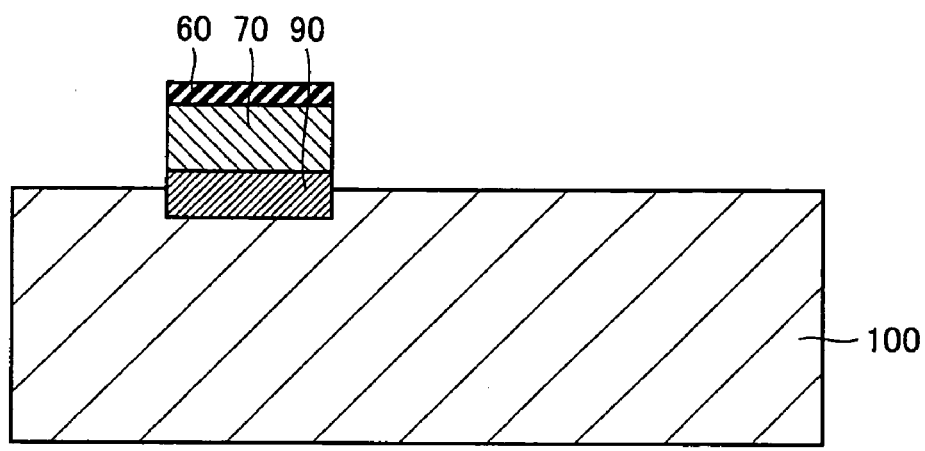
Figure 78:
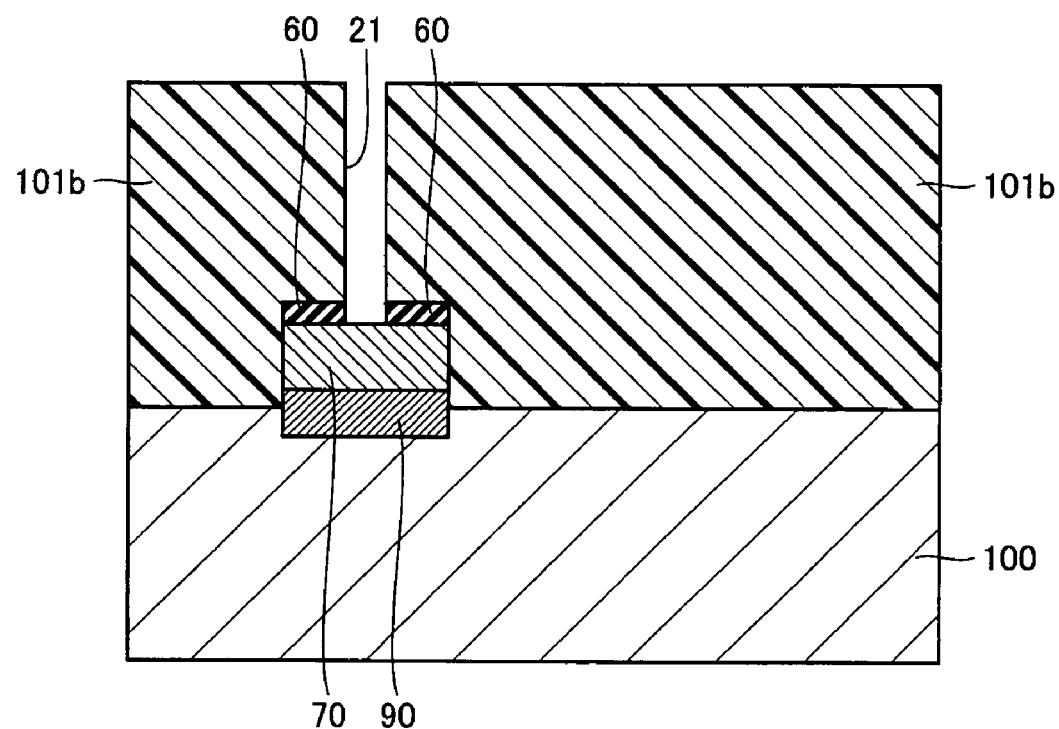

Next, insulation film 60 on resist film 101 and resist film 101 are removed, as shown in FIG. 77. Thereafter, resist film 101b is formed so as to cover the main surface of metal plate 100, insulation film 60, conductive portion 70, and bump 90. Then, hole 21 is formed to penetrate through resist film 101b and insulation film 60 in a direction of thicknesses thereof and reach conductive portion 70. A resulting structure is shown in FIG. 78.

Figure 79:
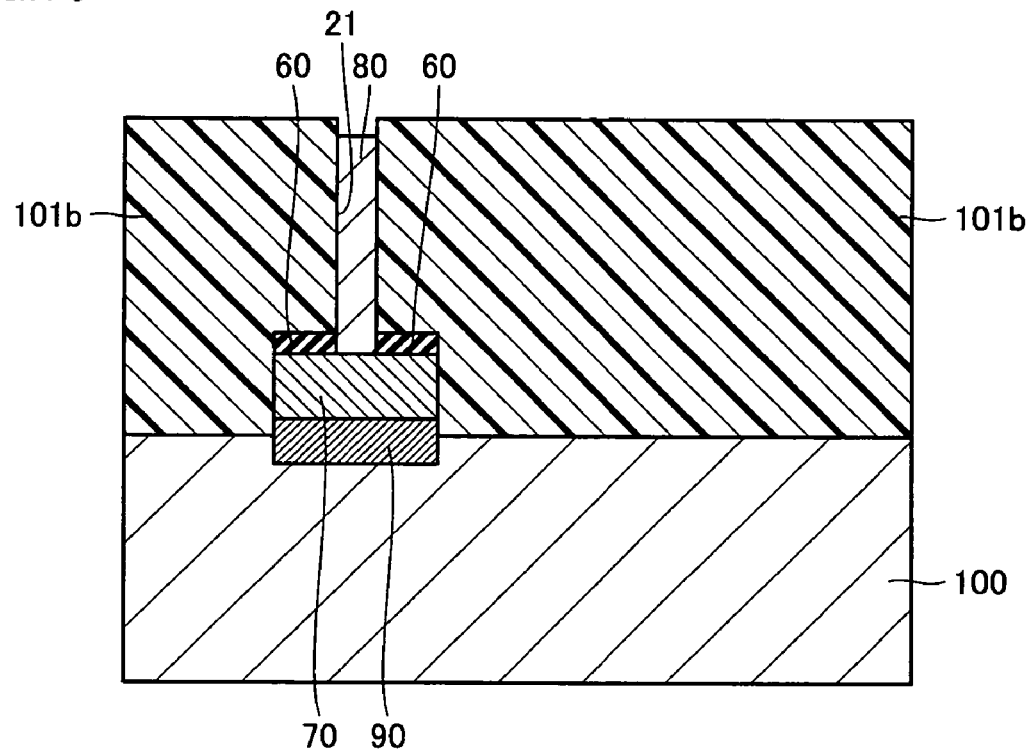
Figure 80:
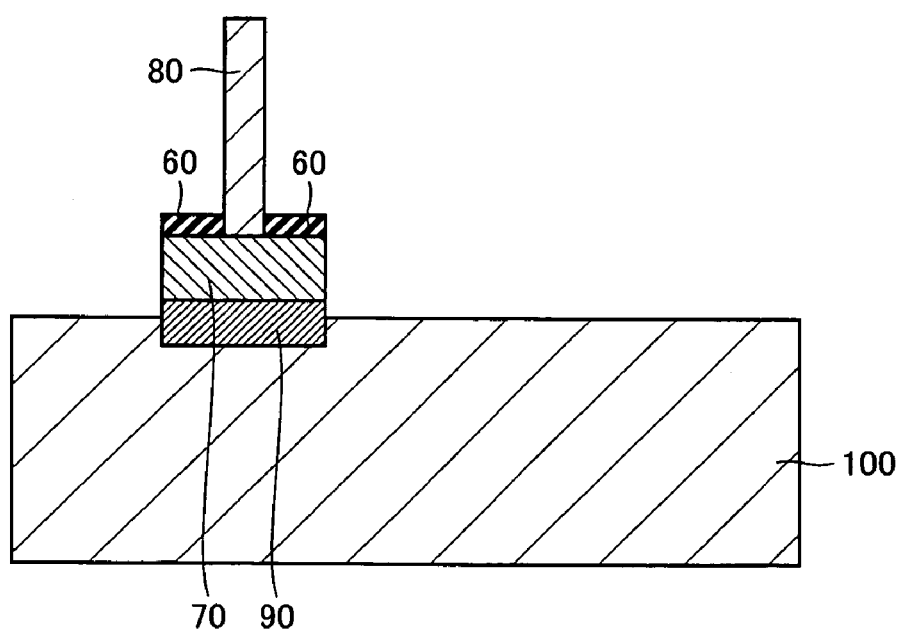
Figure 81:
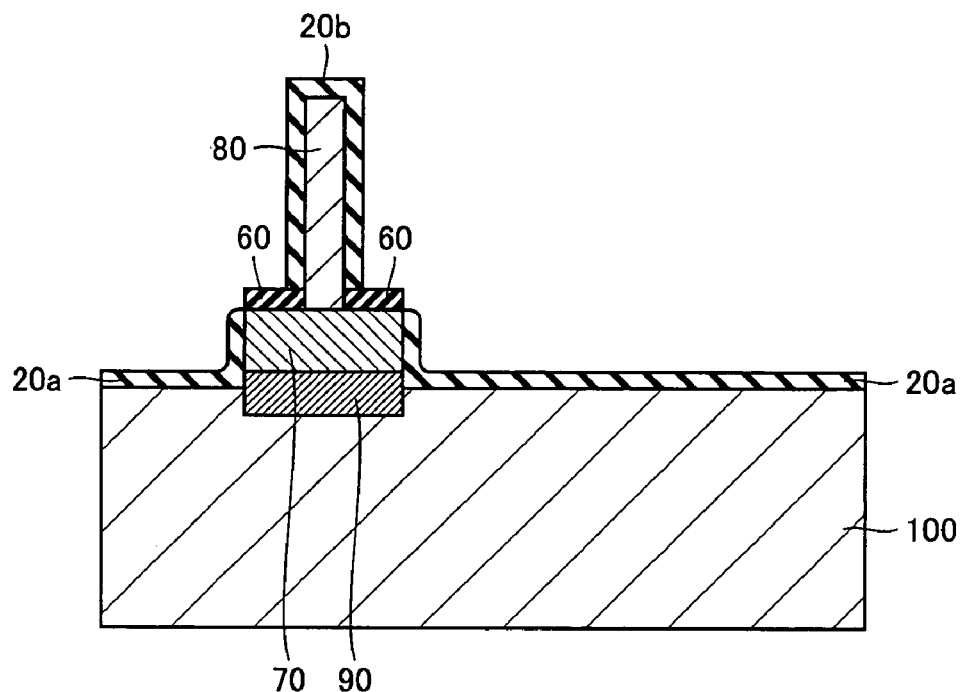
Figure 82:
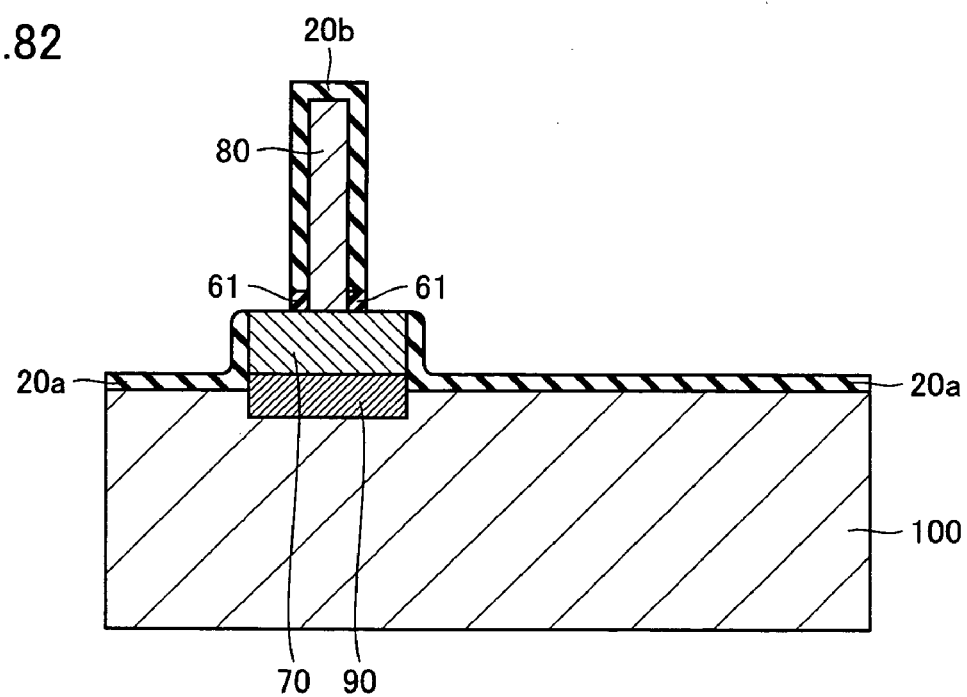

Then, columnar conductive portion 80 is formed in hole 21. A resulting structure is shown in FIG. 79. Then, resist film 101b is removed. A resulting structure is shown in FIG. 80. Then, insulation film 20b is formed by electrodeposition so as to cover an exposed surface of columnar conductive portion 80. In this step, insulation film 20a is formed so as to cover an upper surface of metal plate 100 and side surfaces of bump 90 and conductive portion 70. A resulting structure is shown in FIG. 81. Then, an unneeded portion of insulation film 60 on an upper surface of conductive portion 70 is removed, as shown in FIG. 82. With this, remaining portion 61 is formed.

Figure 83:
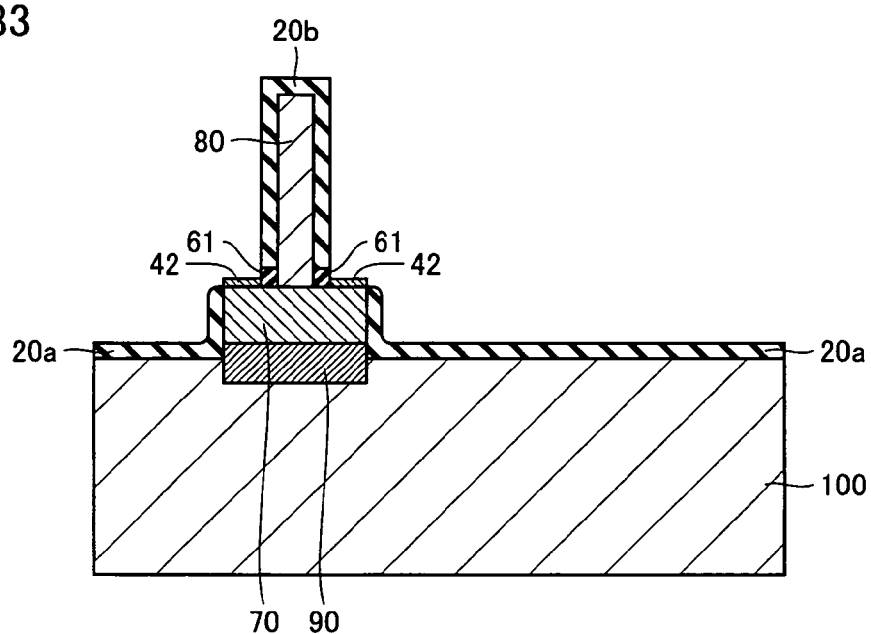

Then, conductive binder 42 is formed on a side surface of remaining portion 61 and an upper surface of conductive portion 70 by electroplating, as shown in FIG. 83. It is to be noted that, this step of forming binder 42 can be omitted. An effect similar to that obtained with the semiconductor device of the second embodiment can also be obtained by fitting the convex substrate shown in FIG. 83 into the concave substrate of the second embodiment.

In addition, though a manner is employed in which insulation film 60 is formed in a position for providing binder 42, an alternative manner may be employed in which, without providing insulation film 60, an opening is formed in a position in an insulation film for providing binder 42 with a step of photolithography using a resist film, which insulation film is provided so as to cover a main surface of the convex substrate.

It is to be noted that, insulation film 20b on an end surface of columnar conductive portion 80 is removed in the step of polishing the back surface of semiconductor substrate 1.

When insulation film 20b is formed to cover the outer peripheral surface of columnar conductive portion 80 as in the semiconductor device of this embodiment, insulation between semiconductor substrate 1 and columnar conductive portion 80 is ensured at least by insulation film 20b even if columnar conductive portion 80 is inserted into hole 13 in a direction diagonal to an extending direction of hole 13 when the concave and convex substrates are fitted with each other. In addition, insulation film 20a functions as a protection film for insulation film 5. Therefore, reliability of the semiconductor device is further increased.

Eleventh Embodiment

Figure 84:
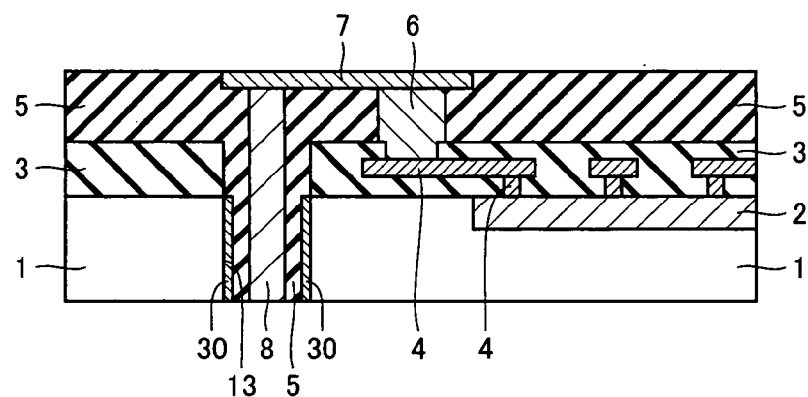
FIG. 84 shows a structure of a semiconductor device according to an eleventh embodiment.

A structure of a semiconductor device according to an eleventh embodiment will now be described using FIG. 84.

The semiconductor device according to this embodiment has a structure similar to that of the semiconductor device according to the first embodiment shown in FIG. 1. The semiconductor device of this embodiment as shown in FIG. 84, however, is different from the semiconductor device of the first embodiment shown in FIG. 1 in that, a conductive film 30 is formed to cover an inner peripheral surface of hole 13. That is, in this embodiment, conductive film 30 is formed in a cylindrical form with keeping a prescribed distance from an outer peripheral surface of columnar conductive portion 8. Conductive film 30 is electrically connected to a ground electrode and has a fixed potential. According to the structure of the semiconductor device of this embodiment, since a structure of a combination of conductive film 30 and columnar conductive portion 8 is similar to a structure of a coaxial cable, a signal input or output via columnar conductive portion 8 is hardly affected adversely by a noise.

A method of manufacturing the semiconductor device of this embodiment will now be described using FIGS. 85-88.

Figure 85:
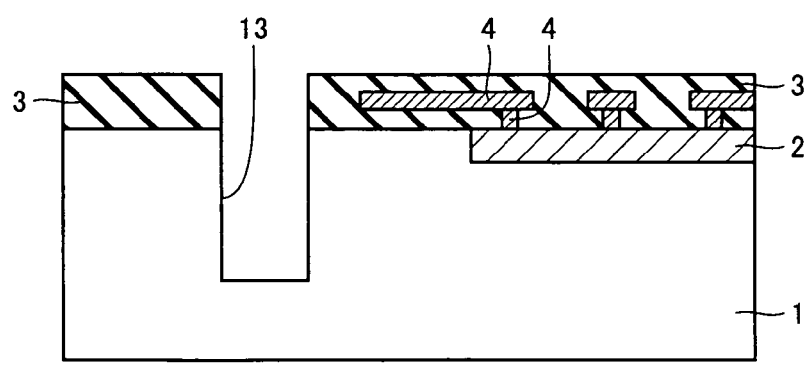
FIGS. 85-88 are views for describing a method of manufacturing the semiconductor device according to the eleventh embodiment.

First, a structure as shown in FIG. 85 is formed. The structure shown in FIG. 85 is similar to that of the semiconductor device shown in FIG. 2 in the first embodiment. In the structure shown in FIG. 85, however, bump 6 in the structure shown in FIG. 2 is still not formed.

Figure 86:
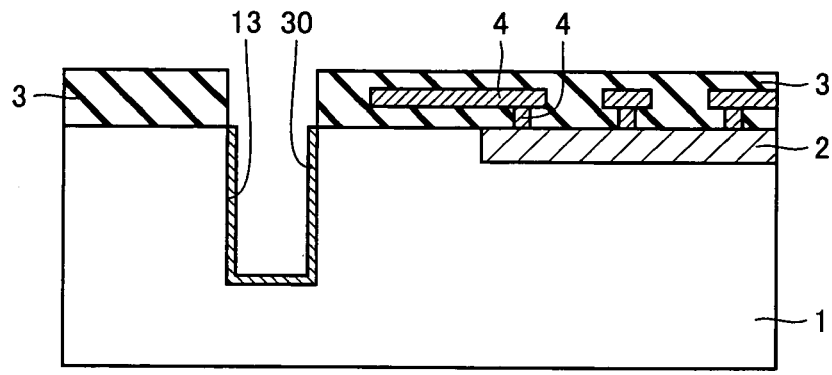
Figure 87:
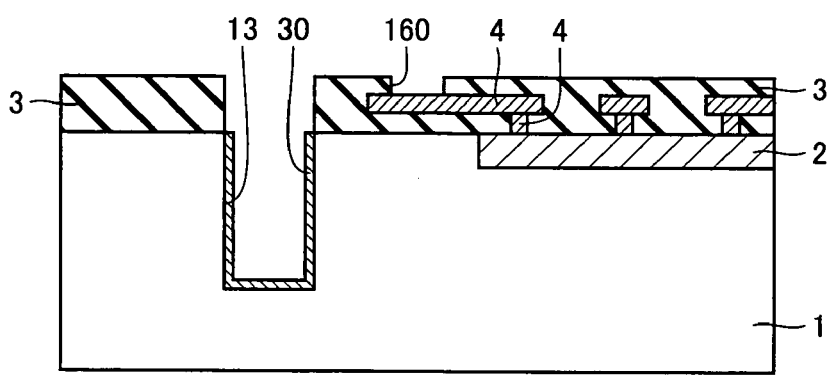

Then, conductive film 30 made of nickel is formed by electroless plating or CVD to cover the inner peripheral surface and bottom surface of hole 13, as shown in FIG. 86. It is to be noted that, conductive film 30 can be formed by electroplating utilizing conductivity of the semiconductor. Then, a hole 160 is formed so as to expose internal interconnection 4, as shown in FIG. 87. Thereafter, bump 6 is formed in hole 160 so as to establish connection with internal interconnection 4, as shown in FIG. 88.

Figure 88:
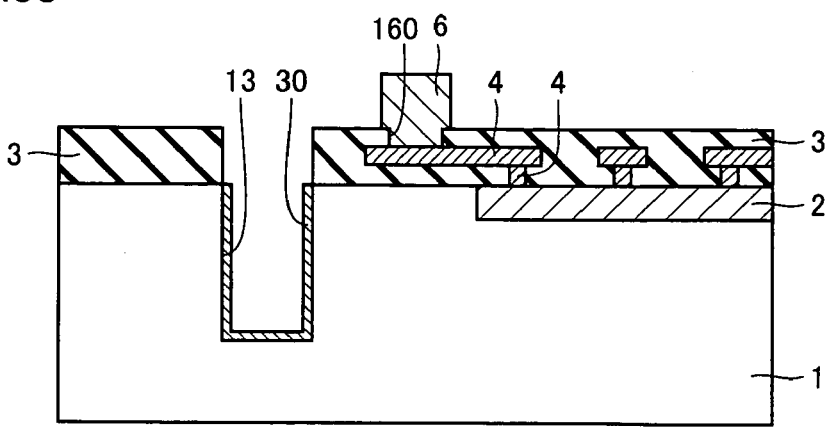
Figure 89:
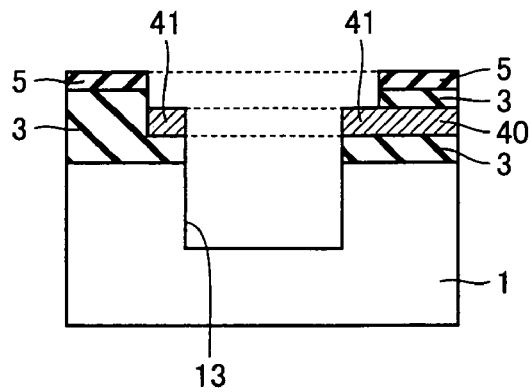
FIG. 89 shows a concave substrate of a semiconductor device according to a twelfth embodiment, which is a cross-sectional view taken along the line LXXXIX-LXXXIX in FIG. 90.
Figure 90:
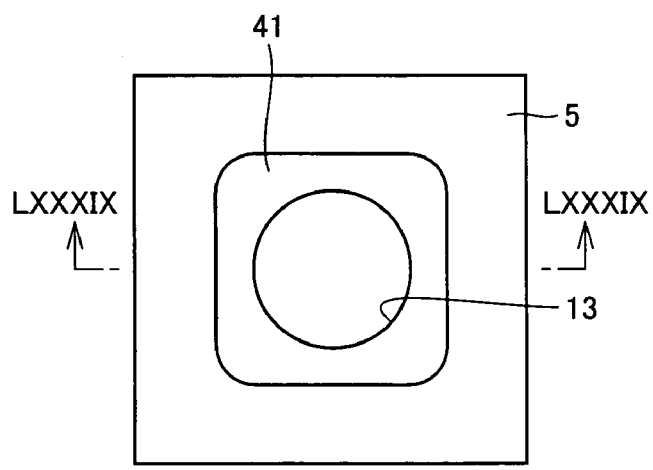
FIG. 90 is a top view of the concave substrate of the semiconductor device according to the twelfth embodiment.
Figure 91:
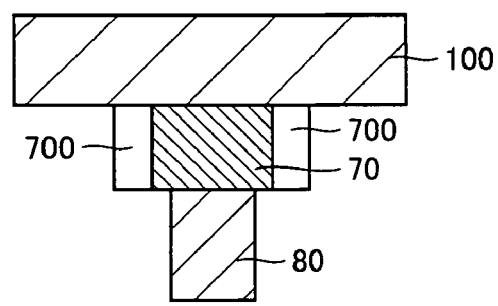
FIG. 91 shows a convex substrate of the semiconductor device according to the twelfth embodiment, which is a cross-sectional view taken along the line XCI-XCI in FIG. 92.
Figure 92:
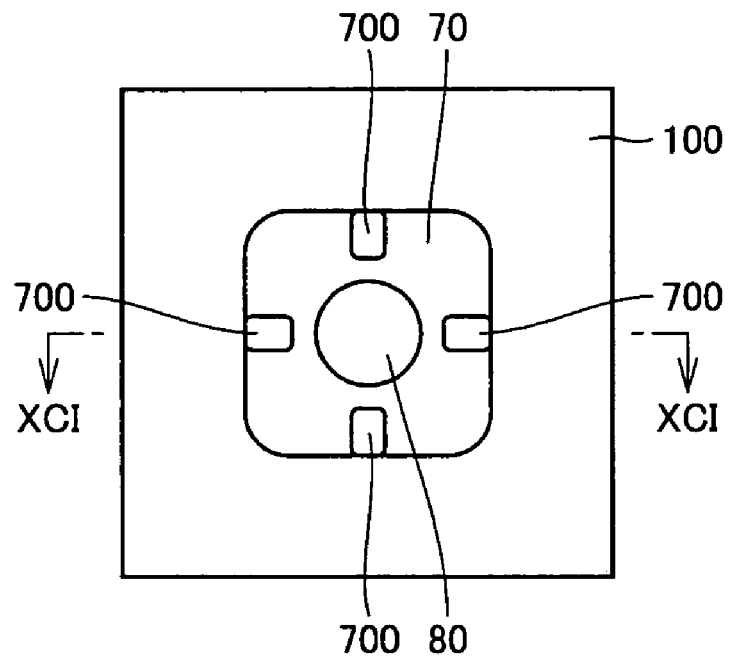
FIG. 92 is a bottom view of the convex substrate of the semiconductor device according to the twelfth embodiment.
Figure 93:
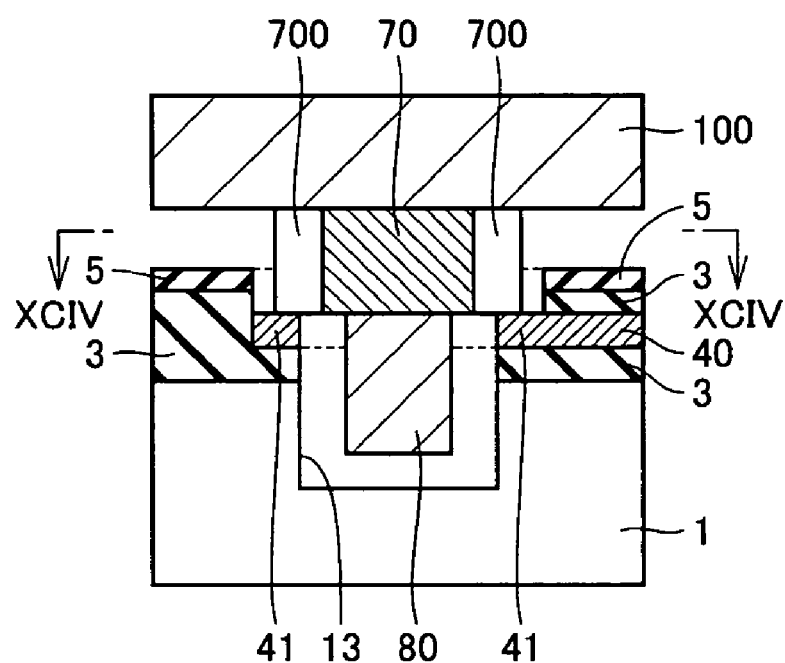
FIG. 93 shows a state in which the concave and convex substrates of the semiconductor device according to the twelfth embodiment are fitted with each other, which is a cross-sectional view taken along the line XCIII-XCIII in FIG. 94.
Figure 94:
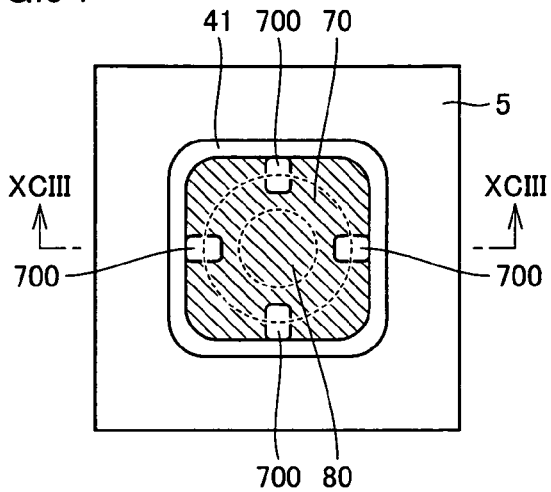
FIG. 94 shows the state in which the concave and convex substrates of the semiconductor device according to the twelfth embodiment are fitted with each other, which is a cross-sectional view taken along the line XCIV-XCIV in FIG. 93.
Figure 95:
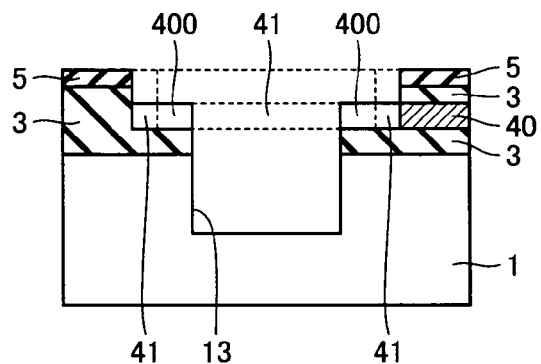
FIG. 95 shows a concave substrate of the semiconductor device according to the twelfth embodiment, which is a cross-sectional view taken along the line XCV-XCV in FIG. 96.
Figure 96:
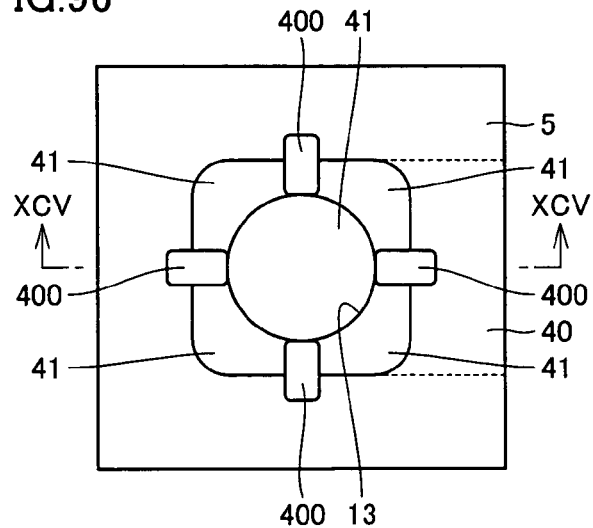
FIG. 96 is a top view of the concave substrate of the semiconductor device according to the twelfth embodiment.
Figure 97:
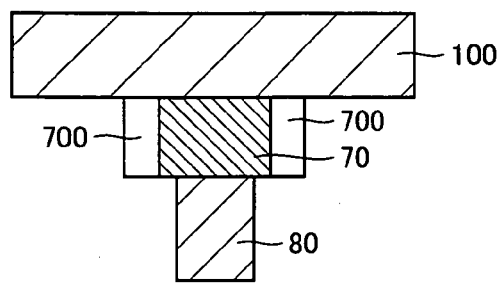
FIG. 97 shows a convex substrate of the semiconductor device according to the twelfth embodiment, which is a cross-sectional view taken along the line XCVII-XCVII in FIG. 98.
Figure 98:
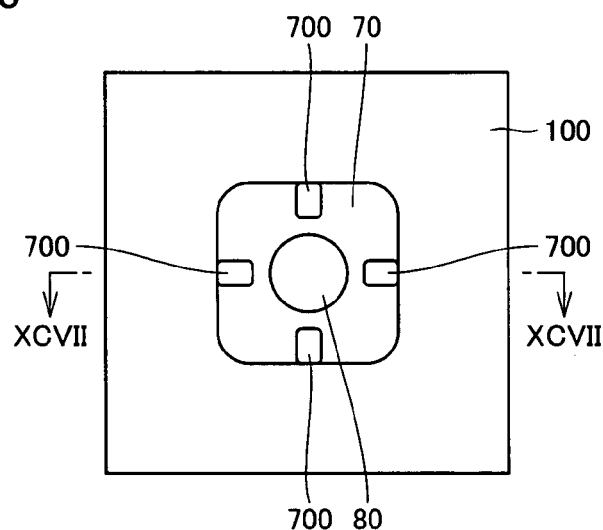
FIG. 98 is a bottom view of the convex substrate of the semiconductor device according to the twelfth embodiment.
Figure 99:
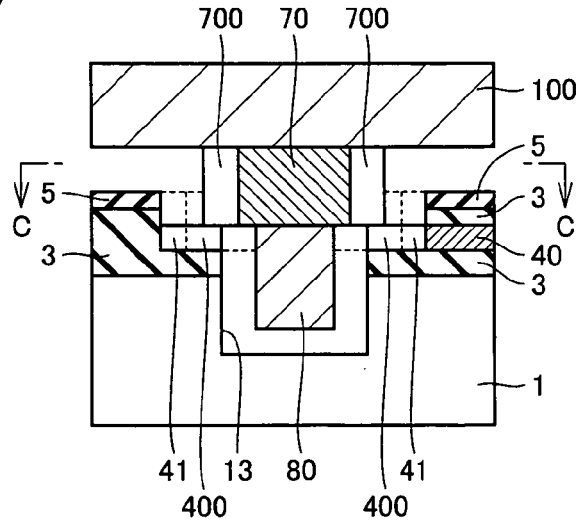
FIG. 99 shows a state in which the concave and convex substrates of the semiconductor device according to the twelfth embodiment are fitted with each other, which is a cross-sectional view taken along the line XCIX-XCIX in FIG. 100.
Figure 100:
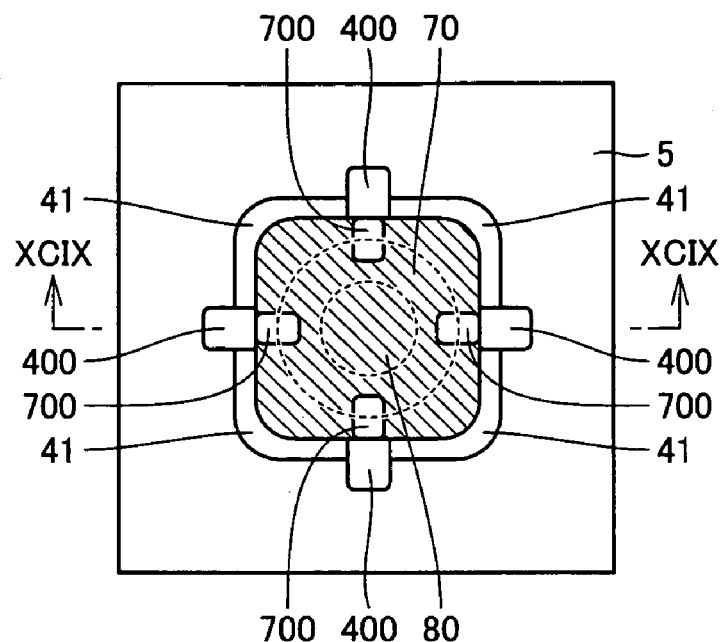
FIG. 100 shows the state in which the concave and convex substrates of the semiconductor device according to the twelfth embodiment are fitted with each other, which is a cross-sectional view taken along the line C-C in FIG. 99.

An effect similar to that obtained with the semiconductor device of the first embodiment can also be obtained with the semiconductor device having the concave substrate shown in FIG. 88 fitted with the convex substrate of the first embodiment.

Twelfth Embodiment

A structure of a semiconductor device according to a twelfth embodiment will now be described using FIGS. 89-94.

The semiconductor device according to this embodiment has a structure similar to that of the semiconductor device according to the second embodiment. The structure of the semiconductor device of this embodiment, however, is different from that of the second embodiment in that, a notch 700 is formed in conductive portion 70.

According to the semiconductor device of this embodiment, when columnar conductive portion 8 is inserted into hole 13 to fit the concave and convex substrates with each other and insulating materials 5a and 5b are extruded from hole 13, insulating materials 5a and 5b in hole 13 flow through notch 700 onto insulation film 3. With this, insulating materials 5a and 5b do not inhibit fitting of the concave and convex substrates. Therefore, yield of the semiconductor device is increased.

In addition, as an alternative method, when the concave and convex substrates are fitted with each other and conductive portion 70 is brought into contact with connection portion 41 while a prescribed clearance is left between the concave and convex substrates, and then fluid insulating materials 5a and 5b are injected into the clearance, insulating materials 5a and 5b flow through notch 700 into a space around columnar conductive portion 80. Therefore, insulating materials 5a and 5b can flow into the space around columnar conductive portion 80 easily. As a result, formation of a void in insulation film 5 is prevented.

It is to be noted that, a structure having a notch 400 provided on connection portion 41 of internal interconnection 40, as shown in FIGS. 95-100, may be adopted as a modified example of the semiconductor device of this embodiment.

With the semiconductor device of the modified example of this embodiment, when the concave and convex substrates are fitted with each other and conductive portion 70 is brought into contact with connection portion 41 while a prescribed clearance is left between the concave and convex substrates, and then fluid insulating materials 5a and 5b are injected into the clearance, insulating materials 5a and 5b flow through notches 400 and 700 into the space around columnar conductive portion 80. Therefore, since notch 400 is provided in the structure shown in FIGS. 95-100, insulating materials 5a and 5b can flow into the space around columnar conductive portion 80 more easily as compared with the above-described structure shown in FIGS. 89-94. As a result, formation of a void in insulation film 5 is prevented more reliably.

Thirteenth Embodiment

A structure of a semiconductor device according to a thirteenth embodiment will now be described.

Figure 101:
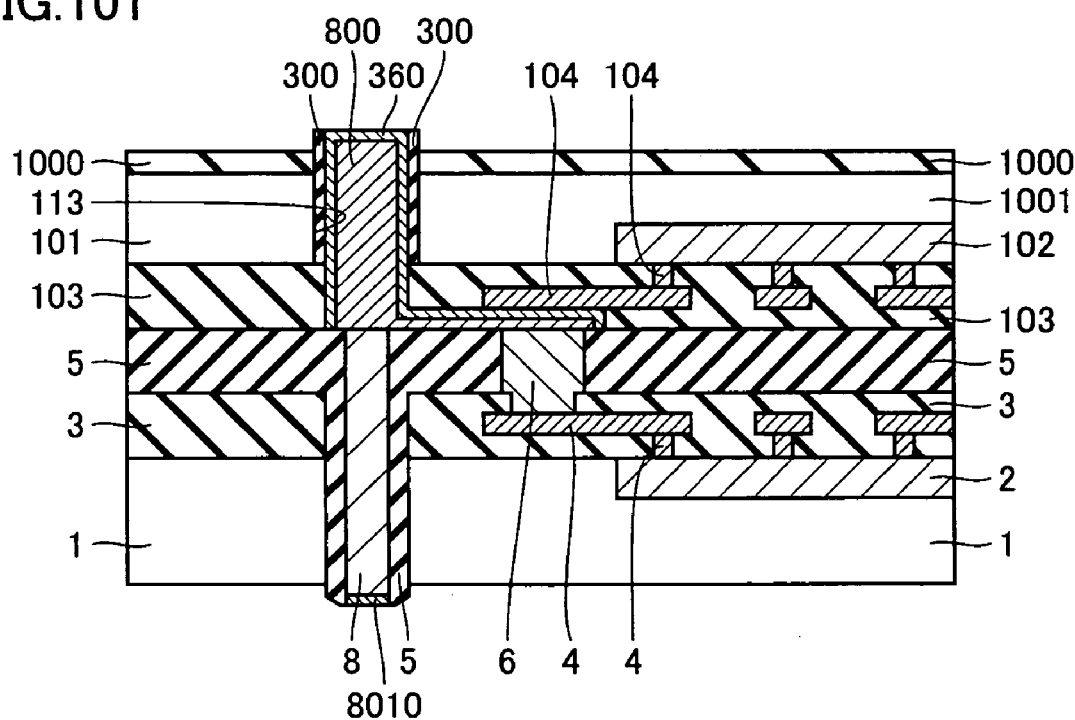
FIG. 101 shows a structure of a semiconductor device according to a thirteenth embodiment.

As shown in FIG. 101, a structure of insulation film 5 and a lower side thereof in the semiconductor device in the thirteenth embodiment is similar to the structure of the semiconductor device according to the first embodiment shown in FIG. 1. The structure of insulation film 5 and the lower side thereof shown in FIG. 101 in this embodiment, however, is different from the structure of the semiconductor device of the first embodiment in that, a conductive film 8010 is provided on an exposed surface of columnar conductive portion 8.

A method of manufacturing a structure of an upper side of insulation film 5 in the semiconductor device shown in FIG. 101 will now be described using FIGS. 102-107.

Figure 102:
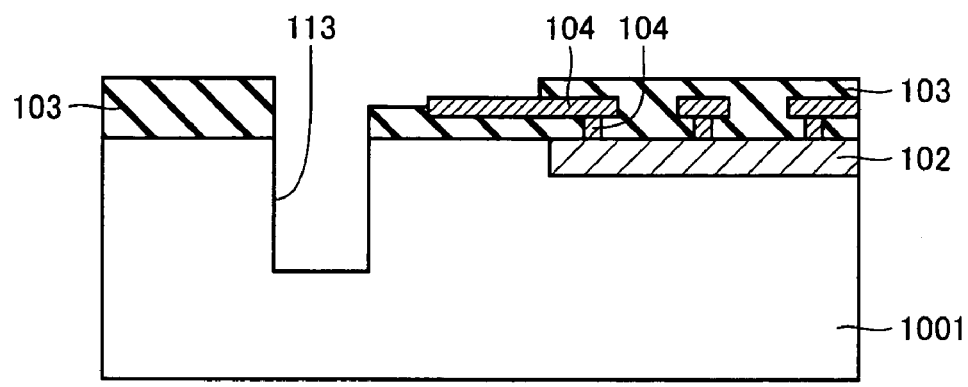
FIGS. 102-107 are views for describing a method of manufacturing the semiconductor device according to the thirteenth embodiment.

In this method, a structure as shown in FIG. 102 is first obtained. The structure shown in FIG. 102 includes a semiconductor substrate 1001. A semiconductor circuit 102 is provided in semiconductor substrate 1001. An insulation film 103 is provided so as to cover a main surface of semiconductor substrate 1001 including semiconductor circuit 102.

An internal interconnection 104 is provided in insulation film 103. A portion of internal interconnection 104 is exposed on a surface of insulation film 103. In addition, a hole 113 is provided in insulation film 103 and semiconductor substrate 1001 to extend in a direction of thicknesses thereof.

Figure 103:
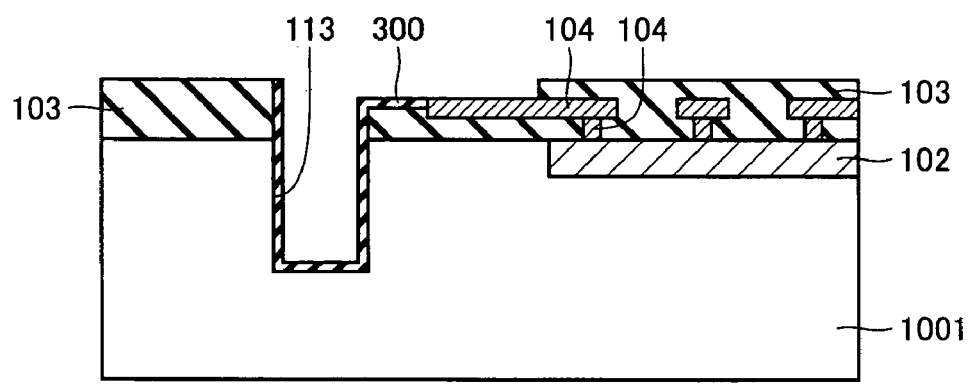
Figure 104:
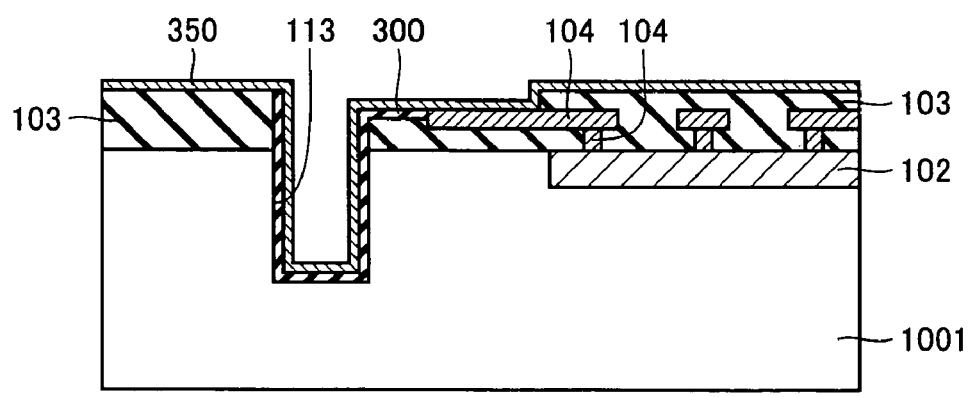

Then, as shown in FIG. 103, an insulation film 300 is formed to cover an inner peripheral surface and a bottom surface of hole 113 as well as one side surface of internal interconnection 104. A conductive film 350 is then formed to cover surfaces of insulation film 103, internal interconnection 104 and insulation film 300, as shown in FIG. 104.

Figure 105:
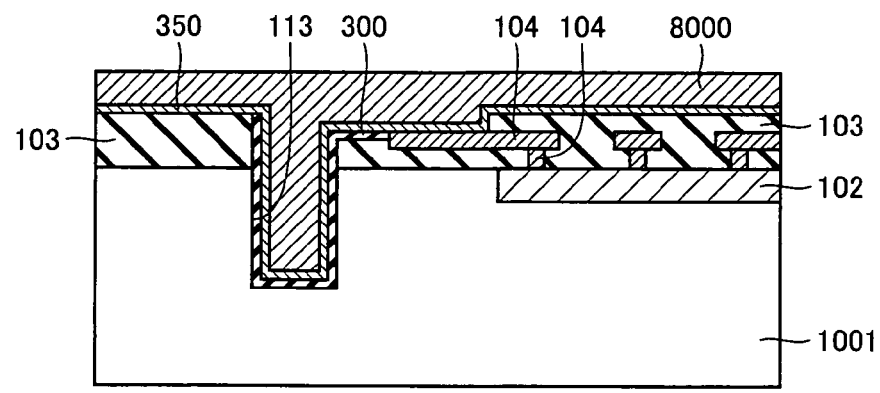
Figure 106:
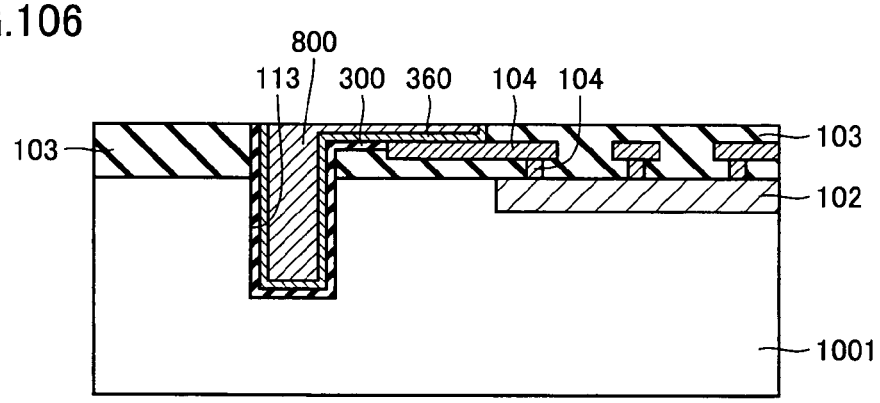
Figure 107:
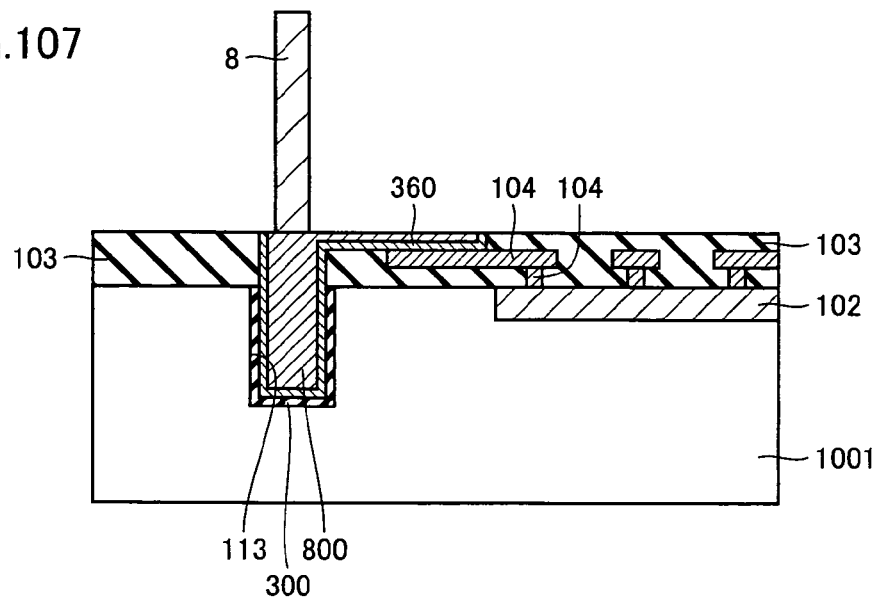

Next, a conductive portion 8000 is formed by electroplating so as to cover conductive film 350, as shown in FIG. 105. Then, as shown in FIG. 106, an upper portion of conductive portion 8000 and a portion of conductive film 350 are removed by CMP (chemical mechanical polishing) to form a columnar conductive portion 800 and a conductive film 360. Then, as shown in FIG. 107, columnar conductive portion 8 is formed to extend from a main surface of columnar conductive portion 800 in a direction perpendicular to a main surface of semiconductor substrate 1. A resulting structure corresponds to the convex substrate shown in FIG. 5 in the first embodiment. A method of forming columnar conductive portion 8 in this embodiment is similar to the method of forming columnar conductive portion 8 in the first embodiment.

The convex substrate shown in FIG. 107 in this embodiment is fitted with the concave substrate shown in FIG. 3 in the first embodiment. Then, the back surface of semiconductor substrate 1 is polished and conductive film 8010 is formed on the exposed surface of columnar conductive portion 8. Thereafter, a back surface of semiconductor substrate 1001 is polished to expose conductive film 360. Then, a protection film 1000 is formed on the back surface of semiconductor substrate 1001. As a result, the semiconductor device having the structure as shown in FIG. 101 is obtained.

With the semiconductor device of this embodiment, an effect similar to that obtained with the semiconductor device of each embodiment described above can also be obtained.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a semiconductor device, comprising the step of preparing a concave substrate and a convex substrate; wherein said concave substrate includes a semiconductor substrate having a semiconductor circuit, a first insulation film provided to cover a main surface of said semiconductor substrate including said semiconductor circuit, and an internal interconnection provided in said first insulation film;

a concave portion is provided in said first insulation film and said semiconductor substrate to extend in a direction of thicknesses of said first insulation film and said semiconductor substrate; and said convex substrate includes a temporary substrate, a conductive portion formed on said temporary substrate, and a columnar conductive portion extending in a direction perpendicular to a main surface of said temporary substrate; said method further comprising the steps of:

fitting said concave substrate with said convex substrate with a fluid insulating material applied on a joint surface of at least one of said convex substrate and said concave substrate, or fitting said concave substrate with said convex substrate with a clearance left therebetween and injecting a fluid insulating material into said clearance;

electrically connecting said conductive portion to said internal interconnection directly or via another member;

setting said fluid insulating material to form a second insulation film;

polishing a back surface of said semiconductor substrate to expose said columnar conductive portion; and removing said temporary substrate to expose said conductive portion.

2. The method of manufacturing a semiconductor device according to claim 1, wherein said convex substrate includes more than one said columnar conductive portion, at least one concave portion is provided in said concave substrate, and more than one said columnar conductive portion is inserted into said one concave portion.

3. The method of manufacturing a semiconductor device according to claim 1, wherein said temporary substrate has conductivity, and the step of preparing said convex substrate includes the steps of forming a mold for forming said columnar conductive portion on said temporary substrate and forming said columnar conductive portion in said mold by electroplating using said temporary substrate as a cathode.

4. The method of manufacturing a semiconductor device according to claim 1, further comprising the step of forming a bump at a tip end of said columnar conductive portion by electroplating.

5. The method of manufacturing a semiconductor device according to claim 1, further comprising the step of forming a protection film to cover a surface of said second insulation film.

6. The method of manufacturing a semiconductor device according to claim 1, further comprising the step of forming a conductive film on a surface of said concave portion along the surface.

7. The method of manufacturing a semiconductor device according to claim 1, wherein
said internal interconnection is provided to surround said columnar conductive portion on a lower side of said conductive portion and contact with a lower surface of said conductive portion,
a notch is provided on at least one of said internal interconnection and said conductive portion, and
said insulating material flows via said notch.

8. The method of manufacturing a semiconductor device according to claim 1, further comprising the step of
forming a third insulation film to cover a whole surface of said columnar conductive portion.

* * * * *